US010558295B2

(12) United States Patent
Imazeki

(10) Patent No.: US 10,558,295 B2
(45) Date of Patent: *Feb. 11, 2020

(54) ELECTRONIC DEVICE

(71) Applicant: Japan Display Inc., Tokyo (JP)

(72) Inventor: Yoshikatsu Imazeki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/398,920

(22) Filed: Apr. 30, 2019

(65) Prior Publication Data

US 2019/0258355 A1    Aug. 22, 2019

Related U.S. Application Data

(63) Continuation of application No. 15/658,953, filed on Jul. 25, 2017, now Pat. No. 10,296,135.

(30) Foreign Application Priority Data

Jul. 29, 2016    (JP) ................................ 2016-149968

(51) Int. Cl.
*G06F 3/045*    (2006.01)
*G06F 3/041*    (2006.01)
(Continued)

(52) U.S. Cl.
CPC ............ *G06F 3/0416* (2013.01); *G06F 3/044* (2013.01); *H01L 21/486* (2013.01);
(Continued)

(58) Field of Classification Search
CPC ........ G06F 3/041; G06F 3/0416; G06F 3/044; G09G 2300/04; H01L 21/486;
(Continued)

(56) References Cited

U.S. PATENT DOCUMENTS 5,939,828 A    8/1999  Matsukaki et al.
6,366,025 B1   4/2002  Yamada
(Continued)

FOREIGN PATENT DOCUMENTS

CN    101387800 B    11/2010
JP    2002-40465 A    2/2002
(Continued)

OTHER PUBLICATIONS

Notice of Examination Results issued in connection with Taiwan Application No. 106123427, dated Oct. 17, 2018.

*Primary Examiner* — Joe H Cheng
(74) *Attorney, Agent, or Firm* — K&L Gates LLP

(57) ABSTRACT

In one embodiment, an electronic device includes first and second substrates, an insulating layer, and a connecting material. The first substrate includes a first conductive layer. The second substrate includes a basement having first and second surfaces, a second conductive layer on the second surface, and a first hole penetrating through the basement. The insulating layer is arranged between the first conductive layer and the basement, and has a second hole. The connecting material connects conductive layers via holes. The first hole has a first opening on a first surface side. The second hole has a third opening on a first conductive layer side which is larger than the first opening.

20 Claims, 17 Drawing Sheets

(51) Int. Cl.
*H01L 23/498* (2006.01)
*H01L 21/48* (2006.01)
*G06F 3/044* (2006.01)
*H01L 23/31* (2006.01)
*H01L 23/522* (2006.01)

(52) U.S. Cl.
CPC .... *H01L 23/3192* (2013.01); *H01L 23/49827* (2013.01); *H01L 23/49833* (2013.01); *H01L 23/5226* (2013.01); *G06F 2203/04103* (2013.01); *G06F 2203/04108* (2013.01); *G06F 2203/04111* (2013.01); *G06F 2203/04112* (2013.01)

(58) Field of Classification Search
CPC ............... H01L 23/31; H01L 23/3192; H01L 23/49827; H01L 23/49833; H01L 23/522; H01L 23/5226
See application file for complete search history.

(56) References Cited

U.S. PATENT DOCUMENTS

| | | |
|---|---|---|
| 6,576,926 B1 | 6/2003 | Yamazaki et al. |
| 6,940,222 B2 | 9/2005 | Sakurai |
| 7,492,337 B2 | 2/2009 | Fukase |
| 7,671,369 B2 | 3/2010 | Yamazaki et al. |
| 8,093,808 B2 | 1/2012 | Koshihara |
| 8,130,177 B2 | 3/2012 | Nakatani et al. |
| 9,287,338 B2 | 3/2016 | So et al. |
| 9,502,365 B2 | 11/2016 | Han et al. |
| 2009/0073336 A1 | 3/2009 | Ichiki |
| 2010/0238096 A1 | 9/2010 | Jeon et al. |
| 2011/0101487 A1 | 5/2011 | Kim et al. |
| 2011/0316810 A1 | 12/2011 | Tsujino et al. |
| 2014/0138720 A1 | 5/2014 | Murakami et al. |
| 2014/0198267 A1 | 7/2014 | Jeong et al. |
| 2014/0354901 A1 | 12/2014 | Zhao et al. |
| 2014/0375907 A1 | 12/2014 | Wu |
| 2016/0034081 A1 | 2/2016 | Peng |
| 2016/0300834 A1 | 10/2016 | Yu et al. |
| 2017/0269437 A1 | 9/2017 | Chen et al. |
| 2017/0271421 A1 | 9/2017 | Jinbo et al. |
| 2018/0031932 A1 | 2/2018 | Koide |
| 2018/0031934 A1 | 2/2018 | Watanabe et al. |
| 2018/0031938 A1 | 2/2018 | Watanabe et al. |
| 2018/0032175 A1 | 2/2018 | Imazeki |
| 2018/0032192 A1 | 2/2018 | Watanabe et al. |
| 2018/0033617 A1 | 2/2018 | Imazeki et al. |
| 2018/0033800 A1 | 2/2018 | Koide |
| 2018/0033969 A1 | 2/2018 | Kamijo et al. |
| 2018/0035540 A1 | 2/2018 | Koide |
| 2018/0035541 A1 | 2/2018 | Kamijo et al. |
| 2018/0035542 A1 | 2/2018 | Osawa et al. |

FOREIGN PATENT DOCUMENTS

| | | |
|---|---|---|
| TW | 2010031295 A1 | 8/2010 |
| TW | 201447718 A | 12/2014 |

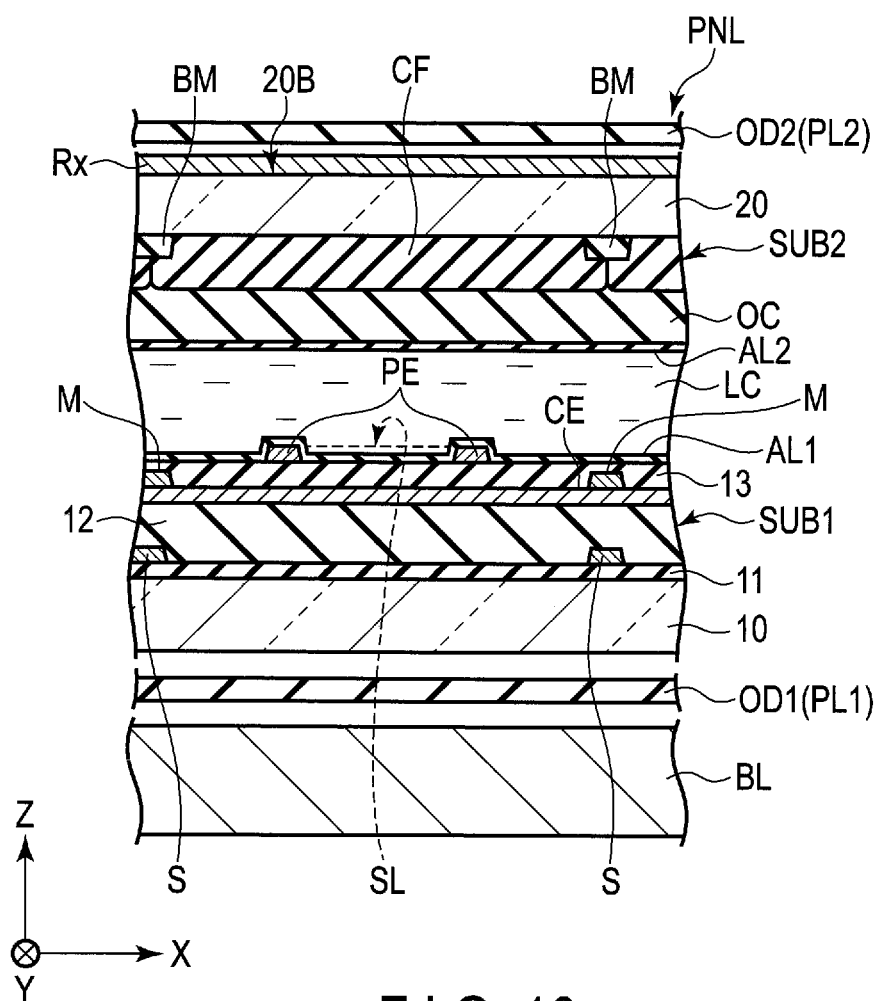
F I G. 10

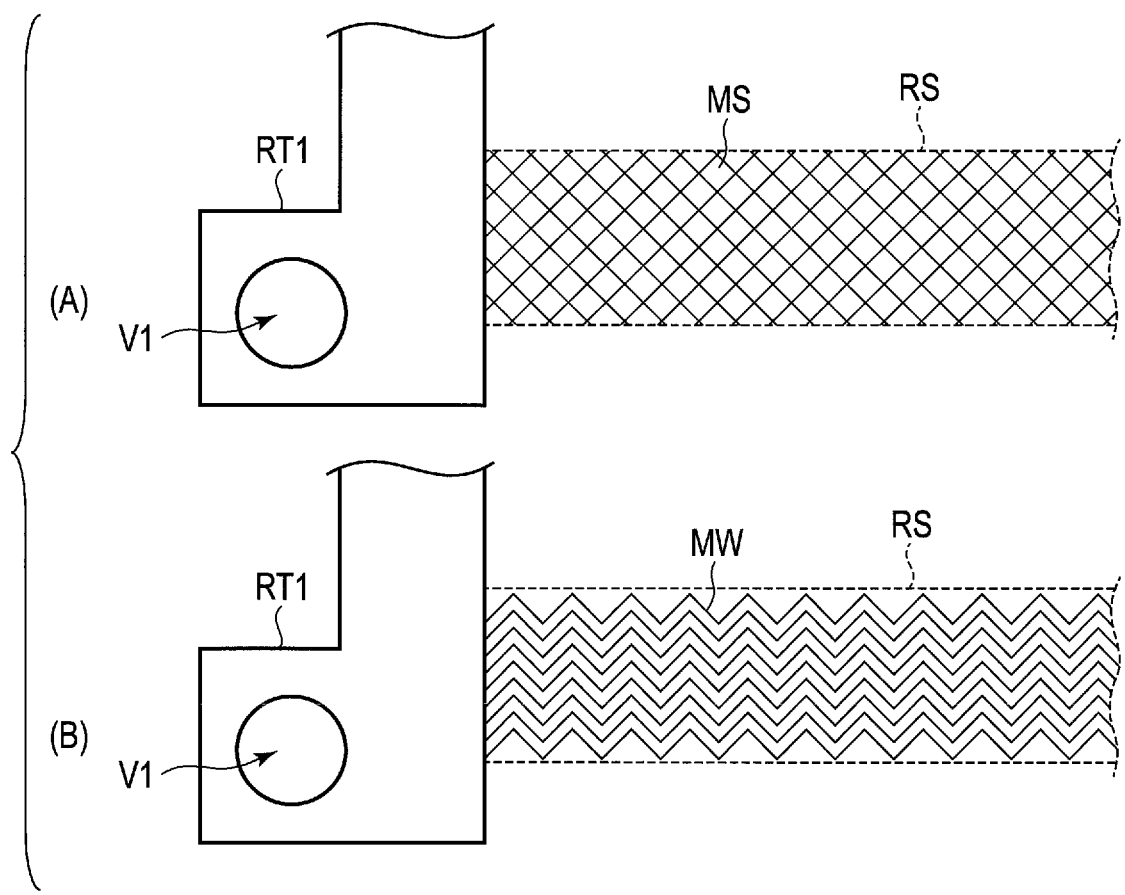
F I G. 12

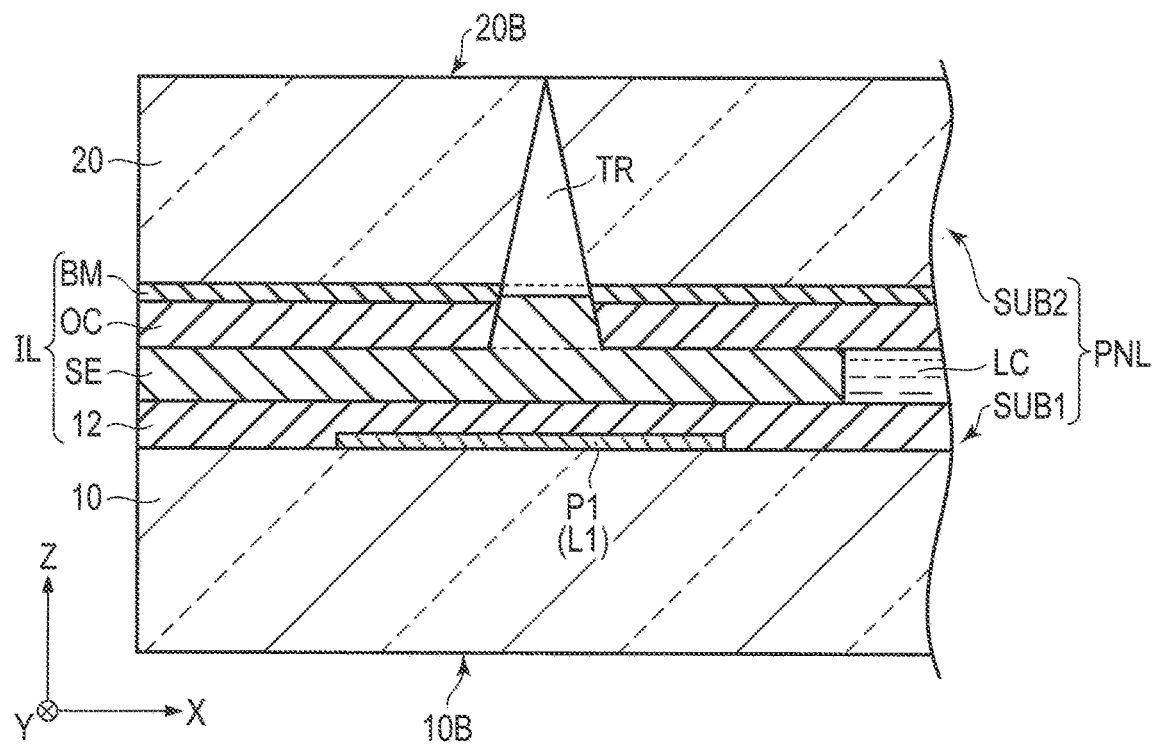
F I G. 16
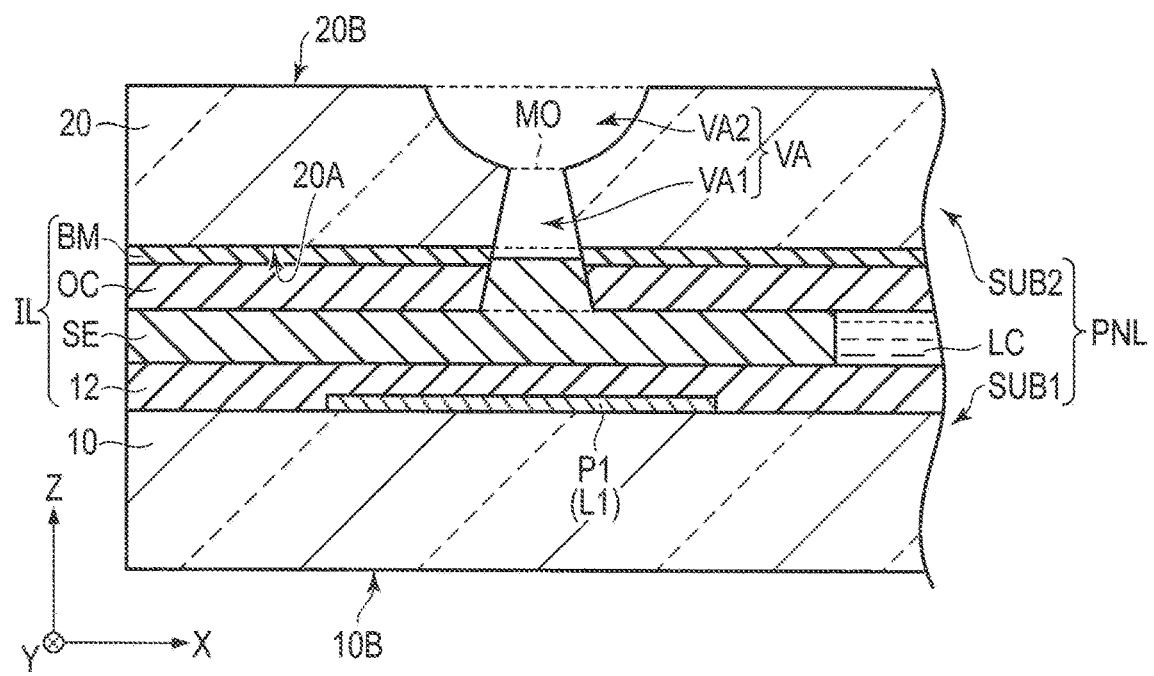
F I G. 17

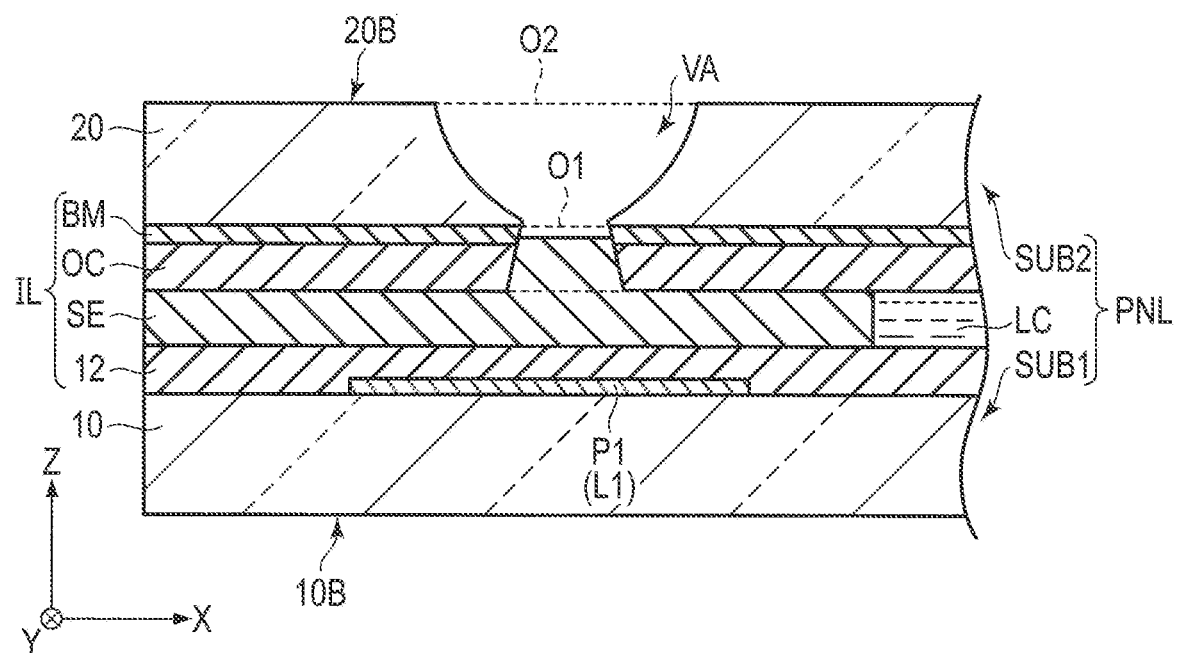
F I G. 18
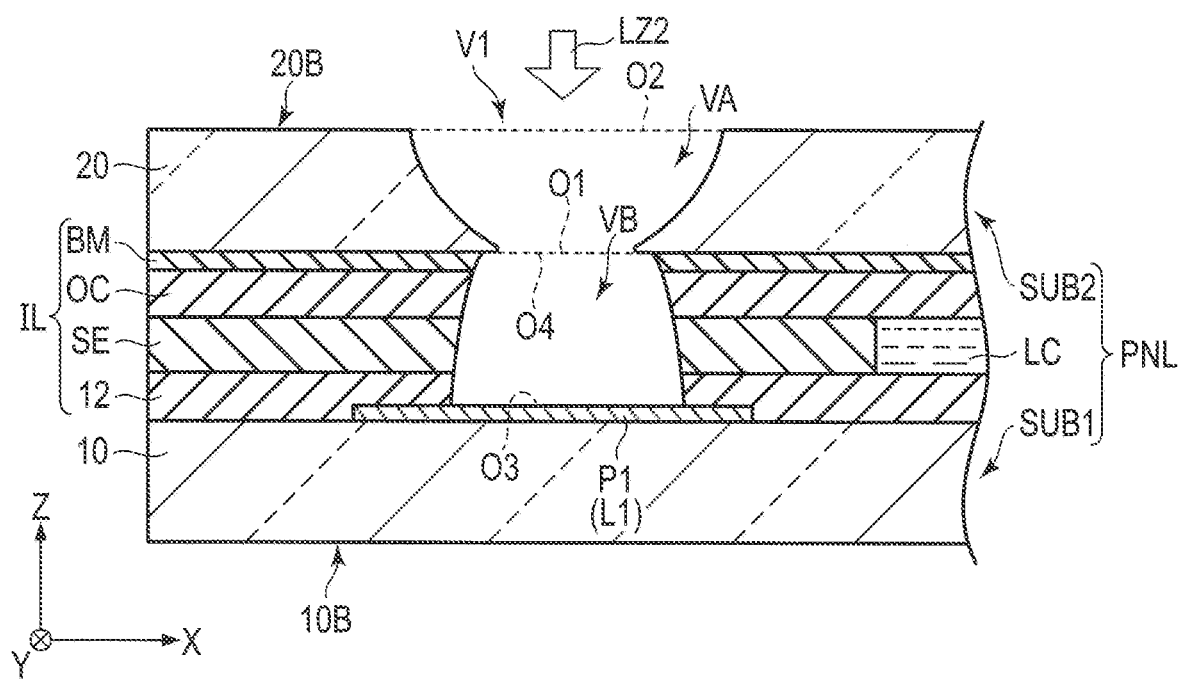
F I G. 19

ELECTRONIC DEVICE

CROSS-REFERENCE TO RELATED APPLICATIONS

This application is a continuation of U.S. patent application Ser. No. 15/658,953, filed on Jul. 25, 2017, now U.S. Pat. No. 10,296,135 B2, which application is based upon and claims the benefit of priority from Japanese Patent Application No. 2016-149968, filed Jul. 29, 2016, the entire contents of which are incorporated herein by reference.

FIELD

Embodiments described herein relate generally to an electronic device.

BACKGROUND

Recently, various techniques for narrowing the frame of a display device have been considered. As an example, a technique of electrically connecting a wire which includes a connector inside a hole which penetrates through between the inner surface and the outer surface of the first resin substrate, and a wire which is provided on the inner surface of the second resin substrate, by an inter-substrate connector.

SUMMARY

The present disclosure relates generally to an electronic device. In an embodiment, an electronic device is provided. The electronic device includes a first substrate which includes a first conductive layer; a second substrate which includes a basement which has a first surface opposed to the first conductive layer and separated from the first conductive layer, and a second surface opposite to the first surface, a second conductive layer which is arranged on the second surface, and a first hole which penetrates through between the first surface and the second surface; an insulating layer which is arranged between the first conductive layer and the basement, and has a second hole which is connected to the first hole; and a connecting material which electrically connects the first conductive layer and the second conductive layer via the first hole and the second hole, wherein the first hole has a first opening on a first surface side and a second opening on a second surface side, the second hole has a third opening on a first conductive layer side and a fourth opening on a basement side, and the third opening is larger than the first opening. Additional features and advantages are described herein, and will be apparent from the following Detailed Description and the figures.

BRIEF DESCRIPTION OF THE DRAWINGS

FIG. 10 is a sectional view showing the structure of a part of the display panel shown in FIG. 8.

FIG. 12 is a diagram showing a structural example of a detector of a detection electrode shown in FIG. 8.

FIG. 16 is a diagram showing the manufacturing method of the display device of one embodiment.

FIG. 17 is a diagram showing the manufacturing method of the display device of one embodiment.

FIG. 18 is a diagram showing the manufacturing method of the display device of one embodiment.

FIG. 19 is a diagram showing the manufacturing method of the display device of one embodiment.

DETAILED DESCRIPTION

Figure 1:
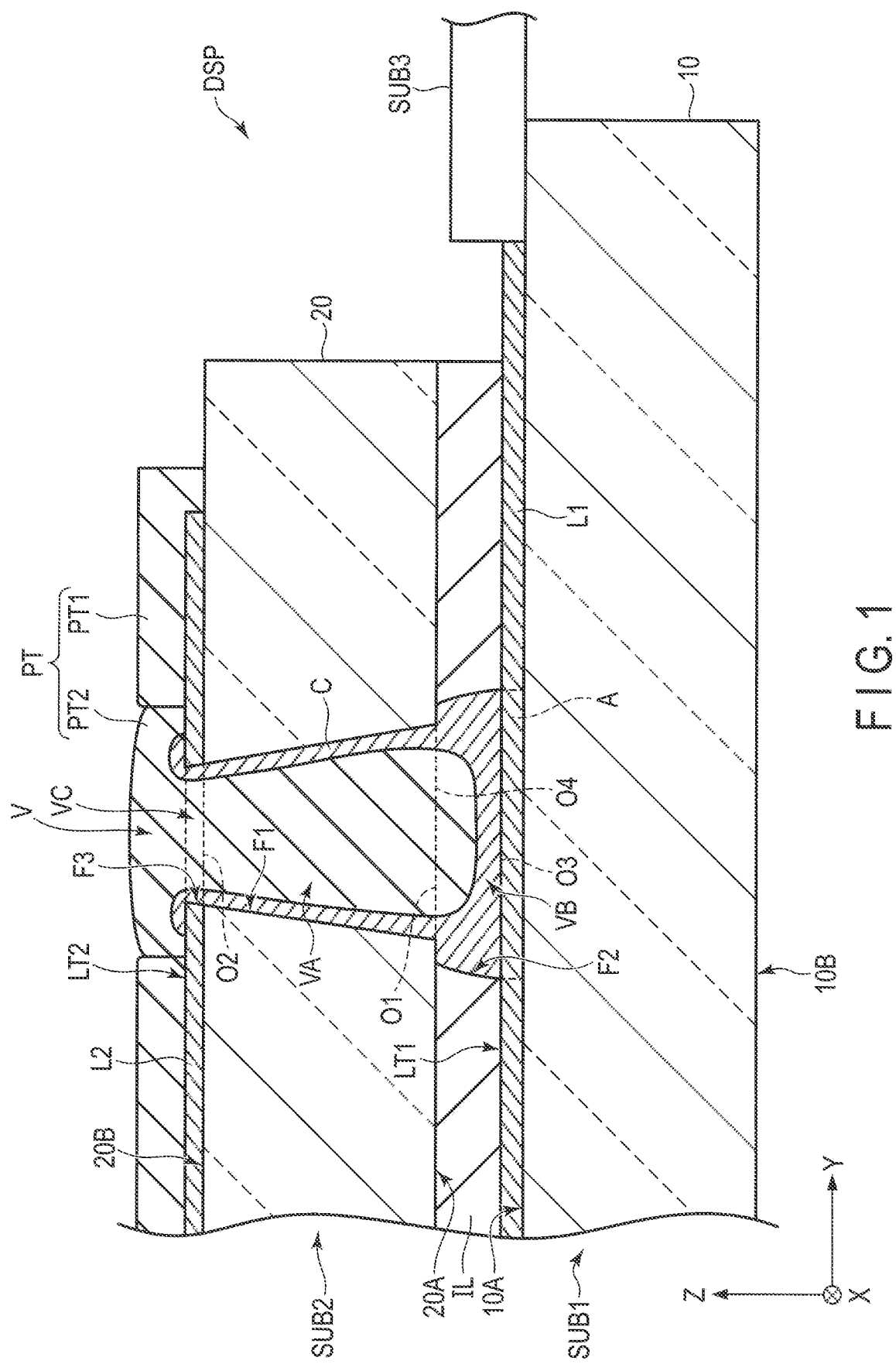
FIG. 1 is a sectional view showing a structural example of a display device of one embodiment.

In general, according to one embodiment, an electronic device includes a first substrate, a second substrate, an insulating layer, and a connecting material. The first substrate includes a first conductive layer. The second substrate includes a basement which has a first surface opposed to the first conductive layer and separated from the first conductive layer and a second surface opposite to the first surface, a second conductive layer which is arranged on the second surface, and a first hole which penetrates through between the first surface and the second surface. The insulating layer is arranged between the first conductive layer and the basement, and has a second hole which is connected to the first hole. The connecting material electrically connects the first conductive layer and the second conductive layer via the first hole and the second hole. The first hole has a first opening on a first surface side and a second opening on a second surface side. The second hole has a third opening on a first conductive layer side and a fourth opening on a basement side. Further, the third opening is larger than the first opening.

According to this structure, it is possible to provide an electronic device which can achieve a narrow frame and low cost.

One embodiment will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the present embodiment, a display device will be described as an example of an electronic device. This display device can be used in various devices such as a smartphone, a tablet computer, a mobile phone, a notebook computer, an in-car device, and a game console. That main structure described in the present embodiment is applicable to a liquid crystal display device, a self-luminous display device such as an organic electroluminescent display device, an electronic paper display device comprising an electrophoresis element, etc., a display device adopting microelectromechanical systems (MEMS), and a display device adopting electrochromism.

FIG. 1 is a sectional view showing a structural example of a display device DSP of the present embodiment. A first direction X, a second direction Y, and a third direction Z orthogonally cross each other but may also cross each other at any angle other than an angle of 90 degrees. The first direction X and the second direction Y correspond to the directions parallel to the surface of a substrate which constitutes the display device DSP, and the third direction Z corresponds to the thickness direction of the display device DSP. The drawing shows a section of a part of the display device DSP in a Y-Z plane which is defined by the second direction Y and the third direction Z.

The display device DSP includes a first substrate SUB1, a second substrate SUB2, an insulating layer IL, a connecting material C, and a wiring substrate SUBS. The first substrate SUB1 and the second substrate SUB2 are opposed to each other in the third direction Z. In the following description, a direction from the first substrate SUB1 toward the second substrate SUB2 is referred to as upward (or merely above), and a direction from the second substrate SUB2 toward the first substrate SUB1 is referred to as downward (or merely below). Further, a view from the second substrate SUB2 toward the first substrate SUB1 is referred to as a plan view. Further, a sectional view of the display device DSP in the Y-Z plane of FIG. 1 (or an X-Z plane which is defined by the first direction X and the third direction Z) is referred to as a sectional view.

The first substrate SUB1 includes a first basement 10, and a first conductive layer L1 which is located on one side of the first basement 10 which is opposed to the second substrate SUB2. The first basement 10 has a first surface 10A which is opposed to the second substrate SUB2, and a second surface 10B which is opposite to the first surface 10A. In the example illustrated, the first conductive layer L1 is located on the first surface 10A. Note that various insulating layers or various conductive layers may be disposed between the first basement 10 and the first conductive layer L1 or above the first conductive layer L1.

The second substrate SUB2 includes a second basement 20 and a second conductive layer L2. The second basement 20 has a first surface 20A which is opposed to the first substrate SUB1, and a second surface 20B which is opposite to the first surface 20A. The second basement 20 is arranged such that the first surface 20A is opposed to the first conductive layer L1 and is separated from the first conductive layer L1 in the third direction Z. In the example illustrated, the second conductive layer L2 is located on the second surface 20B. The first basement 10, the first conductive layer L1, the second basement 20, and the second conductive layer L2 are arranged in this order in the third direction Z. The insulating layer IL is located between the first conductive layer L1 and the second basement 20. The insulating layer IL is formed of, for example, one or several organic insulating layers. Note that the insulating layer IL may include an inorganic insulating layer or another conductive layer. Further, in place of the insulating layer IL, an air layer may be provided. Note that various insulating layers or various conductive layers may be disposed between the second basement 20 and the second conductive layer L2 or above the second conductive layer L2.

In the present embodiment, each of the first basement 10 and the second basement 20 is, for example, a glass substrate formed of alkali-free glass or the like. Each of the first basement 10 and the second basement 20 may also be a resin substrate formed of polyimide or the like. The first conductive layer L1 and the second conductive layer L2 may be formed of a metal material such as molybdenum, tungsten, titanium, aluminum, silver, copper or chromium, an alloy of these metal materials, or a transparent conductive material such as indium tin oxide (ITO) or indium zinc oxide (IZO), and may have a single layer structure or a multilayer structure. It is preferable that the connecting material C should include a metal material such as silver, and should include fine particles of a particle diameter of the order of several nanometers to several tens of nanometers. The insulating layer IL includes, for example, some or all of a light-shielding layer, a color filter, an overcoat layer, an alignment film and a sealing material, which will be described later.

The wiring substrate SUB3 is mounted on the first substrate SUB1 and is electrically connected to the first conductive layer L1. The wiring substrate SUB3 is, for example, a flexible substrate. A flexible substrate applicable to the present embodiment is a flexible substrate which at least partially includes a flexible portion formed of a flexible material. For example, the wiring substrate SUB3 of the present embodiment may be a flexible substrate which is entirely formed as a flexible portion, or may also be a rigid flexible substrate which includes a rigid portion formed of a hard material such as glass epoxy and a flexible portion formed of a flexible material such as polyimide.

Now, the structure for connecting the first conductive layer L1 and the second conductive layer L2 in the present embodiment will be described in detail.

In the second substrate SUB2, the second basement 20 has a hole VA1 (first hole) which penetrates through between the first surface 20A and the second surface 20B. The hole VA has a first opening O1 on the first surface 20A side, and a second opening O2 on the second surface 20B side. The insulating layer IL has a hole VB (second hole) which is connected to the hole VA. The hole VB has a third opening O3 on the first conductive layer L1 side, and a fourth opening O4 on the second basement 20 side. As compared to the hole VA, the hole VB is enlarged in the second direction Y. Note that the hole VB is larger than the hole VA not only in the second direction Y but also in all directions in the X-Y plane. In the example illustrated, the second conductive layer L2 also has a hole VC. The hole VA, the hole VB, and the hole VC are arranged in the third direction Z and located on the same straight line which extends in the third direction Z, and constitute a contact hole V.

The connecting material C electrically connects the first conductive layer L1 and the second conductive layer L2 via the hole VA and the hole VB. In the example illustrated, the connecting material C is in contact with an inner surface F1 of the hole VA, an inner surface F2 of the hole VB, an inner surface F3 of the hole VC, an upper surface LT1 of the first conductive layer L1, and an upper surface LT2 of the second conductive layer L2.

In the example shown in FIG. 1, the first opening O1 is larger than the second opening O2, the third opening O3 is larger than the fourth opening O4, and the fourth opening O4 is larger than the first opening O1. In a sectional view, the hole VA has such a shape that the width increases from the second opening O2 toward the first opening O1. In a sectional view, the hole VB has such a shape that the width increases from the fourth opening O4 toward the third opening O3. In other words, the inner surfaces F1 and F2 of the holes VA and VB are inclined with respect to the third direction Z and taper off.

In the example shown in FIG. 1, the inner surface F1 of the hole VA is linear and the inner surface F2 of the hole VB is curved. However, the inner surface F1 may be curved similarly to the inner surface F2, and the inner surface F2 may be linear similarly to the inner surface F1.

The first conductive layer L1 includes an area A which closes the third opening O3 of the hole VB and is flat. In a plan view, the area A corresponds to a portion which overlaps the third opening O3. In the example shown in FIG. 1, the first conductive layer L1 is also flat in any portion other than the area A. The first surface 10A of the first basement 10 is also flat in any portion including an area which overlaps with the area A in a plan view. Accordingly, the first basement 10 is not provided with any recess or any hole. Therefore, the strength of the first basement 10 near the contact hole V, and furthermore, the strength of the display device DSP can be increased.

In the example illustrated, the vicinity of the center of each of the holes VA, VB and VC is not filled with the connecting material C. Therefore, the connecting material C has a hollow. It is possible to form the connecting material C into such a shape by injecting the connecting material C into the hole VA under standard atmospheric pressure or under less than atmospheric pressure, and removing a solvent contained in the connecting material C. It is also possible to form the connecting material C in the holes VA to VC such that the holes VA to VC are completely filled with the connecting material C.

The second conductive layer L2 and the connecting material C are covered with an insulating protection layer PT. In the example shown in FIG. 1, the protection layer PT includes a first protection layer PT1 and a second protection layer PT2. The first protection layer PT1 covers the upper surface LT2 of the second conductive layer L2. The second protection layer PT2 covers the connecting material C and a part of the upper surface LT2. The inside (the above-described hollow) of the connecting material C is filled with the second protection layer PT2. Each of the first protection layer PT1 and the second protection layer PT2 is formed of, for example, an organic insulating material such as an acrylic resin.

In the above-described structure, the second conductive layer L2 is electrically connected to the wiring substrate SUB3 via the connecting material C and the first conductive layer L1. Therefore, a control circuit for writing a signal to the second conductive layer L2 and reading a signal output from the second conductive layer L2 can be connected to the second conductive layer L2 via the wiring substrate SUB3. That is, there is no need to mount another wiring substrate on the second substrate SUB2 for connecting the second conductive layer L2 and the control circuit.

According to the present embodiment, as compared to the case of mounting another wiring substrate on the second substrate SUB2 in addition to the wiring substrate SUB3 which is mounted on the first substrate SUB1, neither a terminal for mounting the wiring substrate nor a routing wire for connecting the second conductive layer L2 and the wiring substrate will be required. Therefore, in the X-Y plane defined by the first direction X and the second direction Y, the size of the second substrate SUB2 can be reduced, and the width of the frame in the periphery of the display device DSP can be reduced. Further, since another wiring substrate is not required, costs can be reduced, accordingly. In this way, a narrow frame and low cost can be achieved.

Further, since the connecting material C is in contact not only with the inner surface F3 of the second conductive layer L2 in the hole VC but also with the upper surface LT2 of the second conductive layer L2, the contact area between the connecting material C and the second conductive layer L2 can be increased. Therefore, poor connection between the connecting material C and the second conductive layer L2 can be prevented.

Further, since the area A of the first conductive layer L1 does not have any hole and is flat, the contact area between the connecting material C inside the hole VB and the first conductive layer L1 can be increased. Therefore, poor connection between the contacting material C and the first conductive layer L1 can be prevented.

Further, the third opening O3 of the hole VB is larger than the first opening O1 of the hole VA. If the third opening O3 is large, the contact area between the connecting material C and the first conductive layer L1 can be increased. On the other hand, the second opening O2 of the hole VA is smaller than the first opening O1. Therefore, the range of unevenness of the second substrate SUB2 resulting from the contact hole V can be reduced. As the hollow of the connecting material C is filled with the second protection layer PT2, such unevenness is also suppressed.

Figure 2:
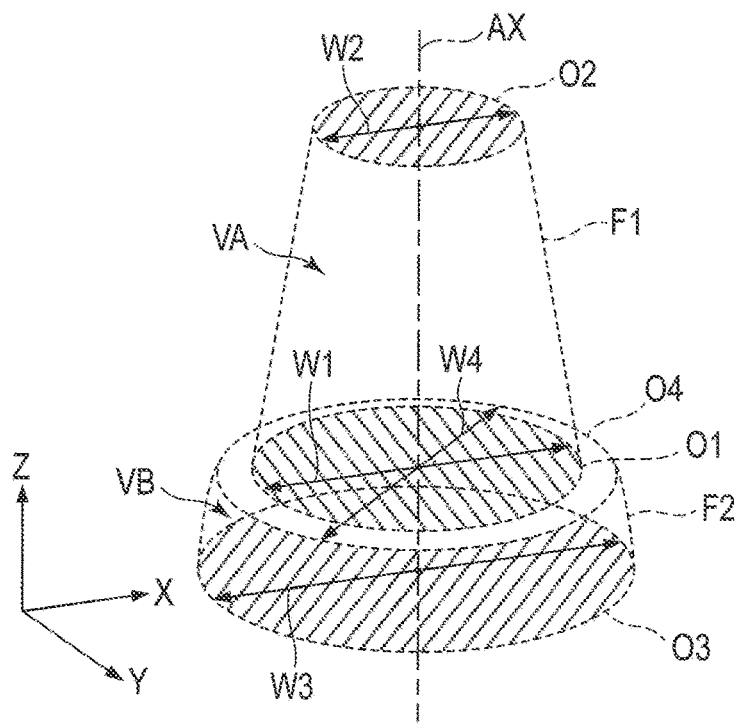
FIG. 2 is a perspective view showing a structural example of a hole of one embodiment.

FIG. 2 is a perspective view showing a structural example of each of the hole VA and the hole VB. In the example illustrated, each of the first opening O1, the second opening O2, the third opening O3, and the fourth opening O4 is a perfect circle. The hole VA is a truncated cone. The hole VB is formed in a shape similar to a truncated cone, and as shown in FIG. 1, the inner surface F2 is curved in a sectional view. The first opening O1, the second opening O2, and the third opening O3 correspond respectively to the shaded areas. The fourth opening O4 corresponds to an area which surrounds the first opening O1.

The width of the first opening O1 is W1, the width of the second opening O2 is W2, the width of the third opening O3 is W3, and the width of the fourth opening O4 is W4. A straight line AX parallel to the third direction Z passes thorough the center of each of the openings O1 to O4. If each of the openings O1 to O4 is a perfect circle, the widths W1 to W4 correspond to the diameters of the openings O1 to O4, respectively.

The width W1 is greater than the width W2, and the width W3 is greater than the width W4. Further, in the example shown in FIG. 2, the width W4 is greater than the width W1. That is, an inequality expressed as W2<W1<W4<W3 is established. From another perspective, the area of the first opening O1 is greater than the area of the second opening O2, the area of the third opening O3 is greater than the area of the fourth opening O4, and the area of the fourth opening O4 is greater than the area of the first opening O1. Each of these areas corresponds to an area in the X-Y plane.

Note that each of the openings O1 to O4 is not necessarily a perfect circle and may be an ellipse or in various other shapes. For example, in the case of an ellipse, each of the widths W1 to W4 may correspond to the length of a major axis (longest diameter) thereof or may also correspond to the length of a minor axis (shortest diameter) thereof. Further, the outline of each of the openings O1 to O4 may be meandering. In that case, for example, each of the openings O1 to O4 may be approximated to a perfect circle or an ellipse, and the diameters, the lengths of major axes, or the lengths of minor axes of the openings O1 to O4 may be defined respectively as the widths W1 to W4, or the largest diameters or the average diameters of the openings O1 to O4 may be defined respectively as the widths W1 to W4.

Figure 3:
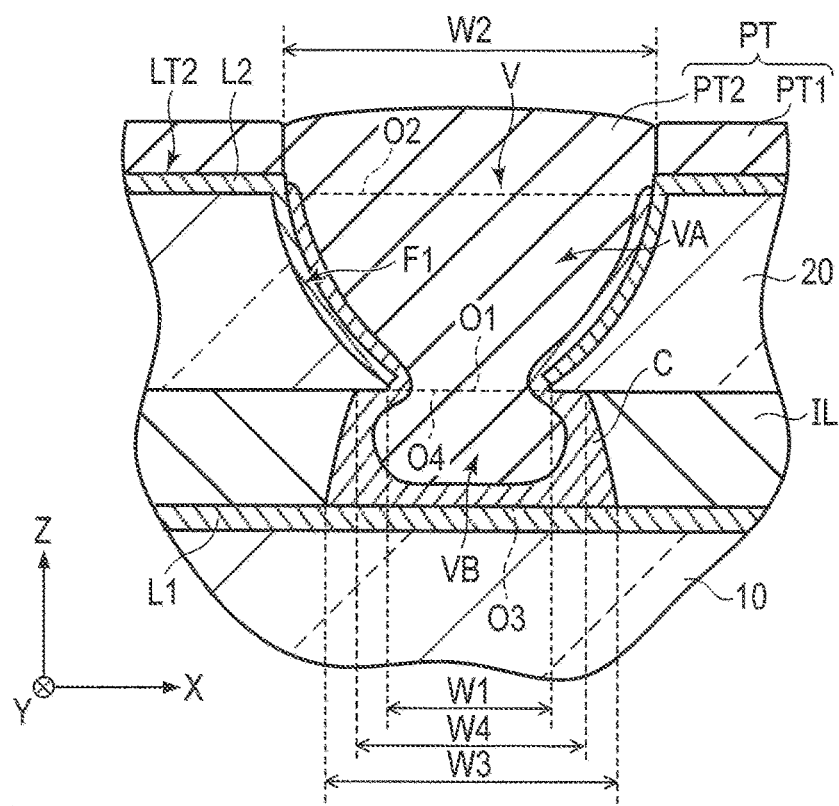
FIG. 3 is a sectional view showing another structural example of a contact hole.

FIG. 3 is a sectional view showing another structural example of the contact hole V. This structural example differs from the structural example shown in FIG. 1 in the shape of the hole VA. That is, in the hole VA shown in FIG. 3, the first opening O1 is smaller than the second opening O2. Further, the second opening O2 is larger than the third opening O3 and the fourth opening O4. Therefore, for example, regarding the widths W1 to W4 of the openings O1 to O4, an inequality expressed as W1<W4<W3<W2 is established. Similarly, the areas of the openings O1 to O4 can be listed in the same order. Note that the second opening O2 may be smaller than the third opening O3 or the fourth opening O4.

The hole VA has such a shape that the width increases from the first opening O1 toward the second opening O2. Further, the inner surface F1 is curved in the hole VA shown in FIG. 3. As a whole, the hole VA has the shape of a bowl to which the hole VB is attached at the bottom. Note that the inner surface F1 may be linear instead.

The second conductive layer L2 may cover the entire surface of the inner surface F1 of the hole VA or may cover a part of the inner surface F1. FIG. 3 shows an example where the second conductive layer L2 entirely covers the inner surface F1 of the hole VA. Further, the connecting material C covers the second conductive layer L2 in the hole VA. Still further, if the second conductive layer L2 covers one part of the inner surface F1 of the hole VA, the connecting material C covers the second conductive layer L2 and the other part of the inner surface F1. That is, the second conductive layer L2 is formed between the connecting material C and the inner surface F1 inside the hole VA. The connecting material C does not cover the upper surface LT2 of the second conductive layer L2, but as in the case of the example shown in FIG. 1, the connecting material C may cover the upper surface LT2 of the second conductive layer L2.

Figure 4:
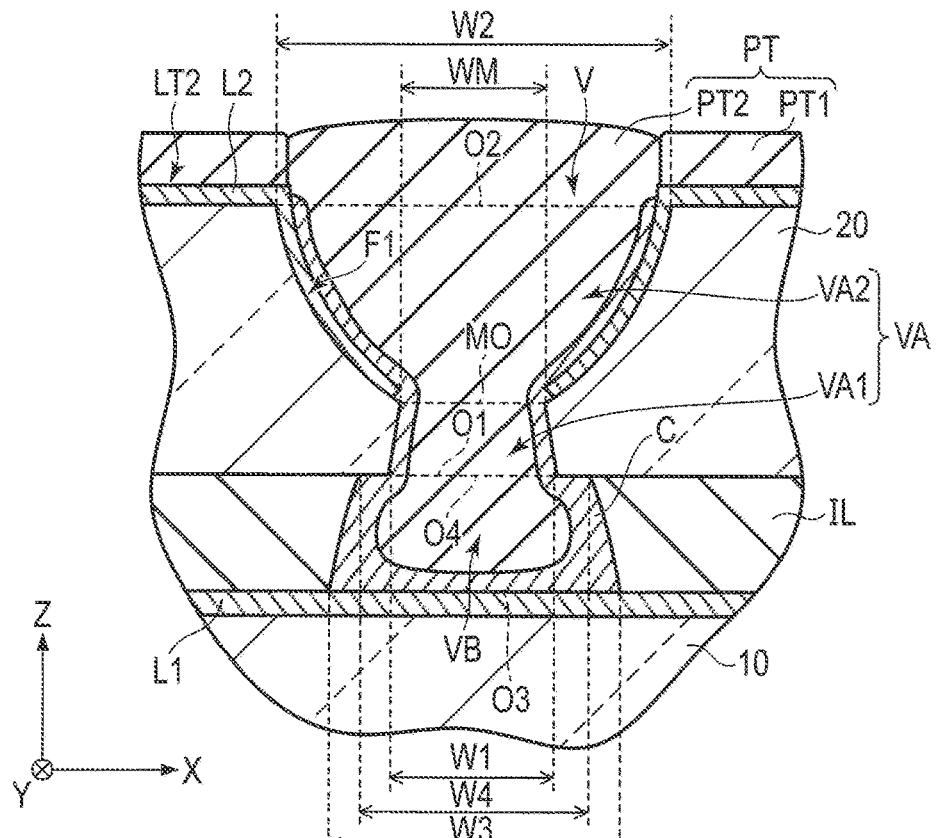
FIG. 4 is a sectional view showing another structural example of the contact hole.

FIG. 4 is a sectional view showing another structural example of the contact hole V. This structural example differs from the structural example shown in FIG. 1 in the shape of the hole VA. That is, the hole VA shown in FIG. 4 includes an intermediate portion MO located between the first opening O1 and the second opening O2. The first opening O1 is smaller than the second opening O2 in the hole VA shown in FIG. 4. The intermediate portion MO is smaller than the first opening O1 and the second opening O2. The second opening O2 is larger than the third opening O3 and the fourth opening O4. Therefore, an inequality expressed as WM<W1<W4<W3<W2 is established, where WM is the width of the intermediate portion MO. Similarly, the areas of the openings O1 to O4 and the portion MO can be listed in the same order. Note that the second opening O2 may be smaller than the third opening O3 or the fourth opening O4. Further, the intermediate portion MO may be larger than or equal to the first opening O1.

The hole VA includes a first portion VA1 from the first opening O1 to the intermediate portion MO, and a second portion VA2 from the intermediate portion MO to the second opening O2. The first portion VA1 has such a shape that the width increases from the intermediate portion MO toward the first opening O1. The second portion VA2 has such a shape that the width increases from the intermediate portion MO toward the second opening O2. The first portion VA1 has the inner surface F1 which is linear and is inclined with respect to the third direction Z in a sectional view, and tapers off. On the other hand, the second portion VA2 has the inner surface F1 which is curved in a sectional view, and generally has the shape of a bowl to which the first portion VA1 is attached at the bottom. Note that the inner surface F1 may also be curved in the first portion VA1. Further, the inner surface F1 may also be linear in the second portion VA2.

The second conductive layer L2 covers the inner surface F1 in the second portion VA2. Further, the connecting material C covers the inner surface F1 in the first portion VA1, and covers the second conductive layer L2 in the second portion VA2. The connecting material C does not cover the upper surface LT2 of the second conductive layer L2, but as in the case of the example shown in FIG. 1, the connecting material C may cover the upper surface LT2 of the second conductive layer L2.

Figure 5:
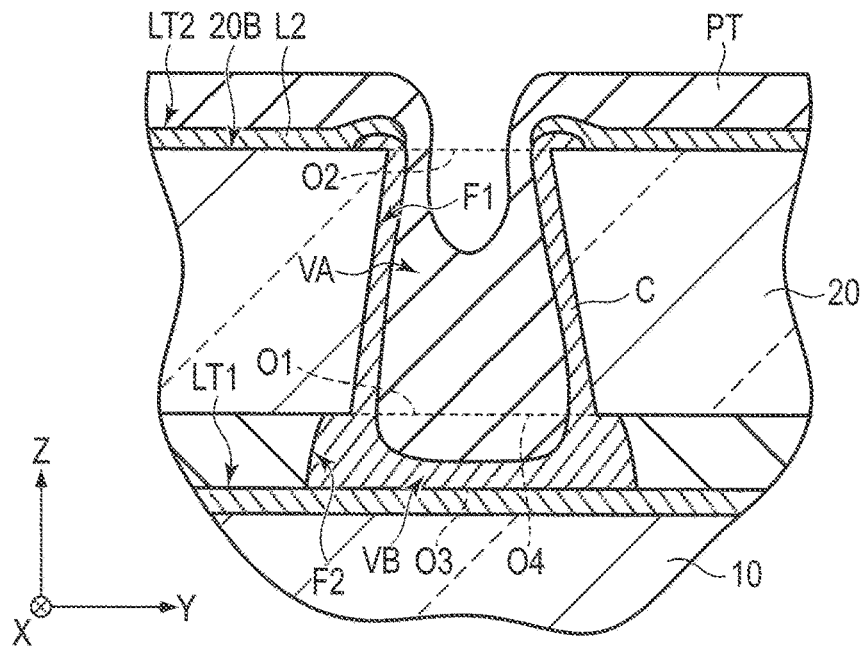
FIG. 5 is a sectional view showing another structural example of the contact hole.
Figure 6:
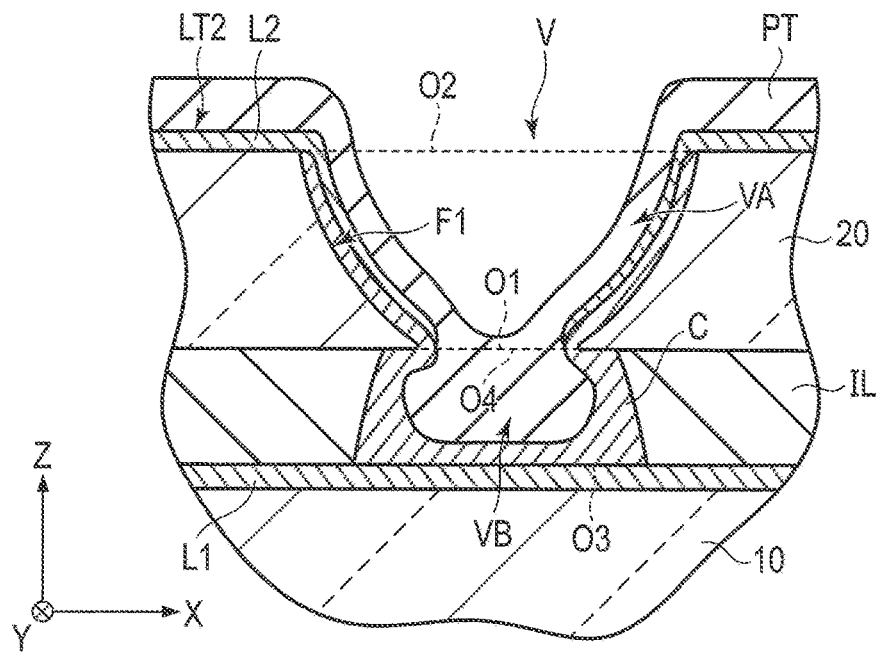
FIG. 6 is a sectional view showing another structural example of the contact hole.
Figure 7:
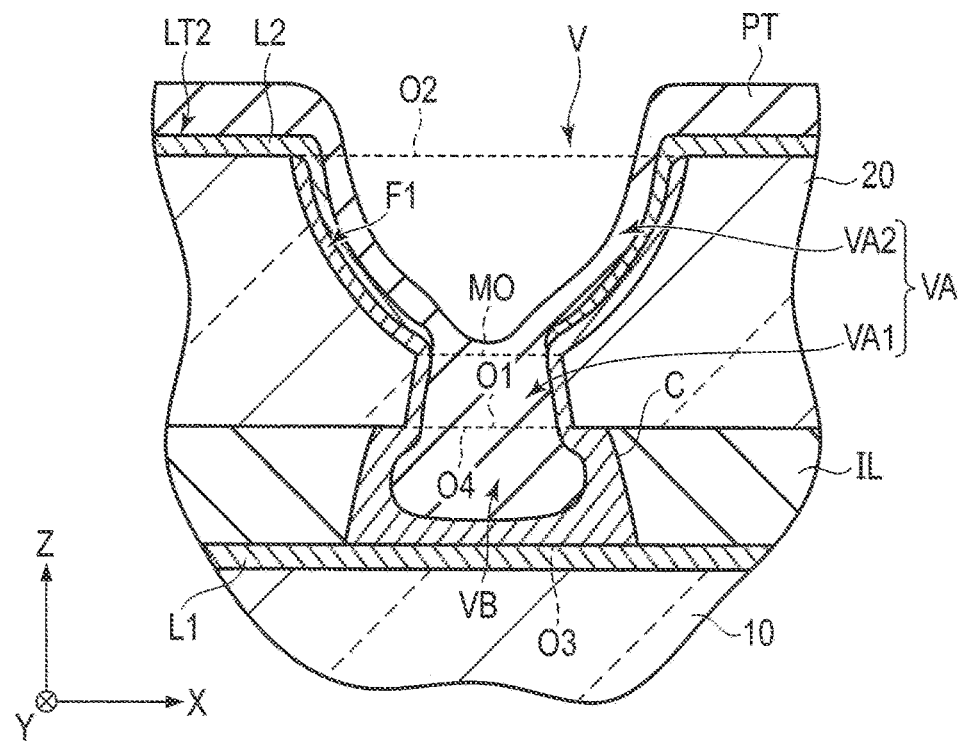
FIG. 7 is a sectional view showing another structural example of the contact hole.

FIGS. 5 to 7 show sectional views of other structural examples of the contact hole VA. The structural example shown in FIG. 5 differs from the structural example shown in FIG. 1 in that the connecting material C covers the second surface 20B of the second basement 20 and the second conductive layer L2 is provided over the connecting material C, in the circumference of the hole VA. The structural examples shown in FIGS. 6 and 7 differ from the structural examples shown in FIGS. 3 and 4, respectively, in that the connecting material C covers the inner surface F1 and the second conductive layer L2 is provided over the connecting material C, in the hole VA. That is, in the structural examples shown in FIGS. 6 and 7, the connecting material C is formed between the second conductive layer L2 and the inner surface F1, inside the hole VA.

In the structural examples shown in FIGS. 5 to 7, the protection layer PT is not divided into the first protection layer PT1 and the second protection layer PT2 but continuously covers the second conductive layer L2 and the connecting material C. Further, the protection layer PT is depressed in the hole VA in these structural examples, but the protection layer PT may also be flat.

Figure 8:
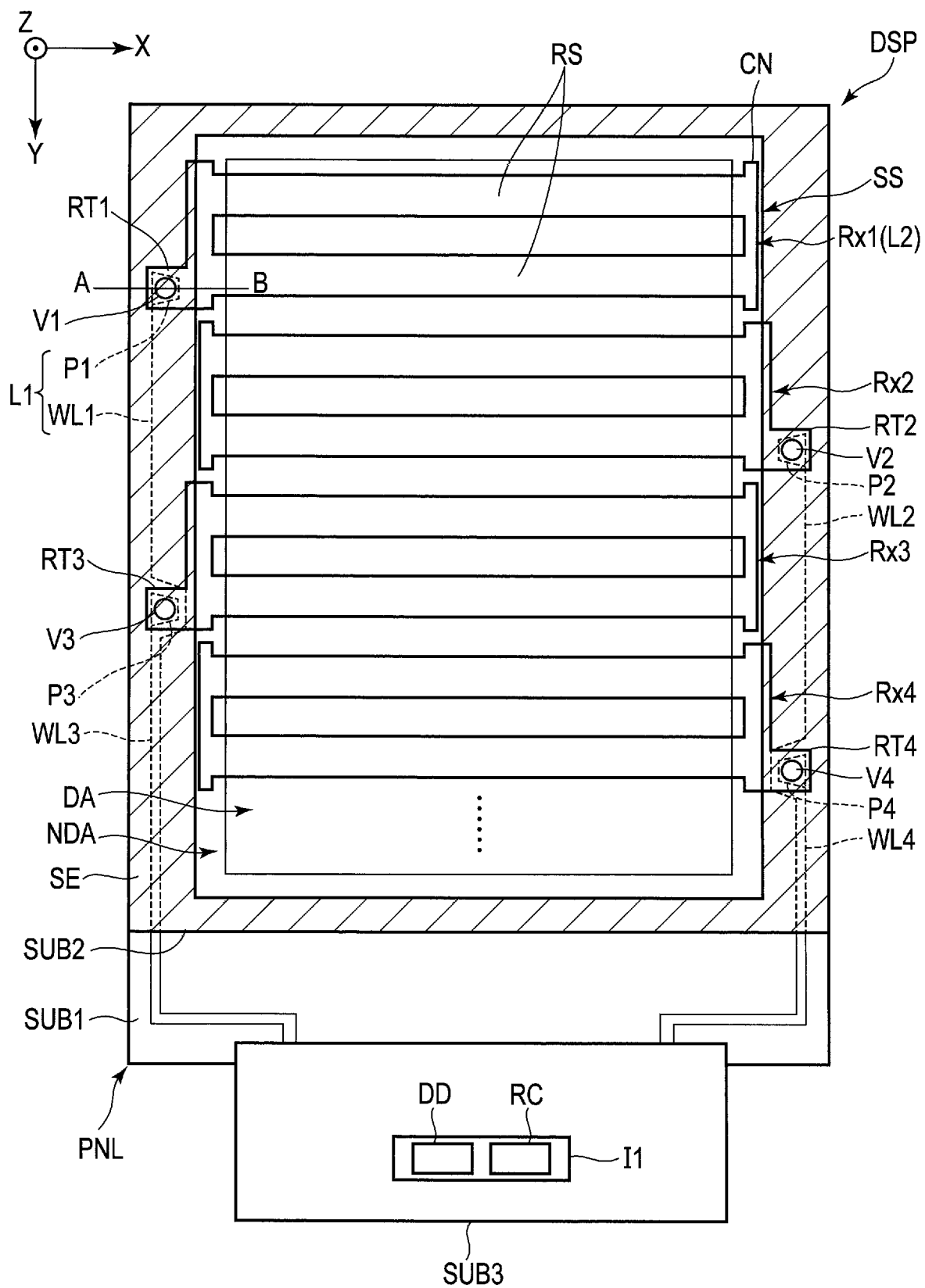
FIG. 8 is a plan view showing a structural example of the display device of one embodiment.

FIG. 8 is a plan view showing a structural example of the display device DSP of the present embodiment. Here, as an example of the display device DSP, a liquid crystal display device which is equipped with a sensor SS will be described.

The display device DSP includes a display panel PNL, an IC chip I1, the wiring substrate SUB3, and the like. The display panel PNL is a liquid crystal display panel, and includes the first substrate SUB1, the second substrate SUB2, the sealing material SE, and a display function layer (liquid crystal layer LC which will be described later). The second substrate SUB2 is opposed to the first substrate SUB1. The sealing material SE corresponds to an area diagonally shaded with rising diagonal lines in FIG. 8, and attaches the first substrate SUB1 and the second substrate SUB2 to each other.

The display panel PNL includes a display area DA which displays an image, and a frame-like non-display area NDA which surrounds the display area DA. The display area DA corresponds to, for example, a first area and is enclosed with the sealing material SE. The non-display area NDA corresponds to, for example, a second area adjacent to the display area DA (first area). The sealing material SE is located in the non-display area NDA.

The IC chip I1 is mounted on the wiring substrate SUB3. Note that the IC chip I1 is not limited to the example shown in the drawing and may be mounted on the first substrate SUB1 which extends to the outside with respect to the second substrate SUB2 or may be mounted on an external circuit board which is connected to the wiring substrate SUB3. In the IC chip I1, for example, a display driver DD which outputs a signal necessary for image display is incorporated. For example, the display driver DD includes at least one of a signal line drive circuit SD, a scanning line drive circuit GD, and a common electrode drive circuit CD which will be described later. In the example illustrated, a detection circuit RC which functions as a touchpanel controller is also incorporated in the IC chip I1. Note that the detection circuit RC may be incorporated in any IC chip other than the IC chip I1.

The display panel PNL may be, for example, a transmissive display panel which has a transmissive display function of displaying an image by selectively transmitting light from below the first substrate SUB1, a reflective display panel which has a reflective display function of displaying an image by selectively reflecting light from above the second substrate SUB2, or a transfletive display panel which has the transmissive display function as well as the reflective display function.

The sensor SS senses an object to be detected being in contact with or in proximity to the display device DSP. The sensor SS includes a plurality of detection electrodes Rx (Rx1, Rx2, Rx3, Rx4, . . . ). The detection electrode RX is provided on the second substrate SUB2 and corresponds to the above-described second conductive layer L2. These detection electrodes Rx extend in the first direction X and are arranged in the second direction Y at intervals. Although FIG. 8 shows the detection electrodes Rx1 to Rx4 as the detection electrodes Rx, the structural example of the detection electrode Rx1 will be mainly described below.

That is, the detection electrode Rx1 includes a detector RS, a terminal RT1, and a connector CN.

The detector RS is located in the display area DA and extends in the first direction X. In the detection electrode Rx1, the detector RS is mainly used for sensing. In the example illustrated, the detector RS is strip-shaped, but more specifically, the detector RS is formed of a collective entity of small thin metal wires as will be described with reference to FIG. 12. Further, one detection electrode Rx1 includes two detector RS strips, but the first detection electrode Rx may include three detectors RS strips or may also include one detector RS strip.

The terminal RT1 is located on one end side of the non-display area NDA in the first direction X and is connected to the detectors RS. The connector CN is located on the other end side of the non-display area NDA in the first direction X and connects the detectors RS to each other. In FIG. 8, one end side corresponds to the left side with respect to the display area DA, and the other side corresponds to the right side with respect to the display area DA. A part of the terminal RT1 is formed in a position which overlaps the sealing material SE in a plan view.

The first substrate SUB1 includes a pad P1 and a wire WL1 which correspond to the above-described first conductive layer L1. The pad P1 and the wire WL1 are located at one end side of the non-display area NDA and overlap the sealing material SE in a plan view. The pad P1 is formed in a position which overlaps the terminal RT1 in a plan view. Further, the pad P1 here is a trapezoid as an example, but the pad P1 may be another polygon or may also be a circle or an ellipse. The wire WL1 is connected to the pad P1, extends in the second direction Y, and is electrically connected to the detection circuit RC of the IC chip I1 via the wiring substrate SUB3.

The contact hole V1 (holes VA and VB) is formed in a position which overlaps the terminal RT1 and the pad P1 in a plan view. In the example illustrated, the contact hole V1 is a circle in a plan view, but is not limited to a circle and may be an ellipse or in various other shapes. As described with reference to FIG. 1 and the like, the connecting material C is provided in the contact hole V1. Accordingly, the terminal RT1 and the pad P1 are electrically connected to each other. That is, the detection electrode Rx1 provided on the second substrate SUB2 is electrically connected to the detection circuit RC via the wiring substrate SUB3 which is connected to the first substrate SUB1. The detection circuit RC reads a sensor signal which is output from the detection electrode Rx, and detects the presence or absence of contact or approach of an object to be detected, the position coordinates of an object to be detected, and the like.

In the example illustrated, the terminals RT1, RT3, . . . , the pads P1, P3, . . . , the wires WL1, WL3, . . . , and the contact holes V1, V3, . . . , of the odd-numbered detection electrodes Rx1, Rx3, . . . are all located on one end side of the non-display area NDA. Further, the terminals RT2, RT4, . . . , the pads P2, P4, . . . , and the wires WL2, WL4, . . . , and the contact holes V2, V4, . . . , of the even-numbered detection electrodes Rx2, Rx4, . . . are all located on the other end side of the non-display area NDA. According to this layout, the width of one side and the width of the other side can be made uniform in the non-display area NDA, and thus this layout is favorable for narrowing the frame.

As illustrated in the drawing, in such a layout where the pad P3 is close to the wiring substrate SUB3 than the pad P1, the wire WL1 is arranged around the pad P3 to the inner side of the pad P3 (that is, to the side close to the display area DA), and is arranged along the wire WL3 on the inner side of the wire WL3 between the pad P3 and the wiring substrate SUB3. Similarly, the wire WL2 is arranged around the pad P4 to the inner side of the pad P4 and is arranged along the wire WL4 on the inner side of the wire WL4 between the pad P4 and the wire substrate SUB3.

Figure 9:
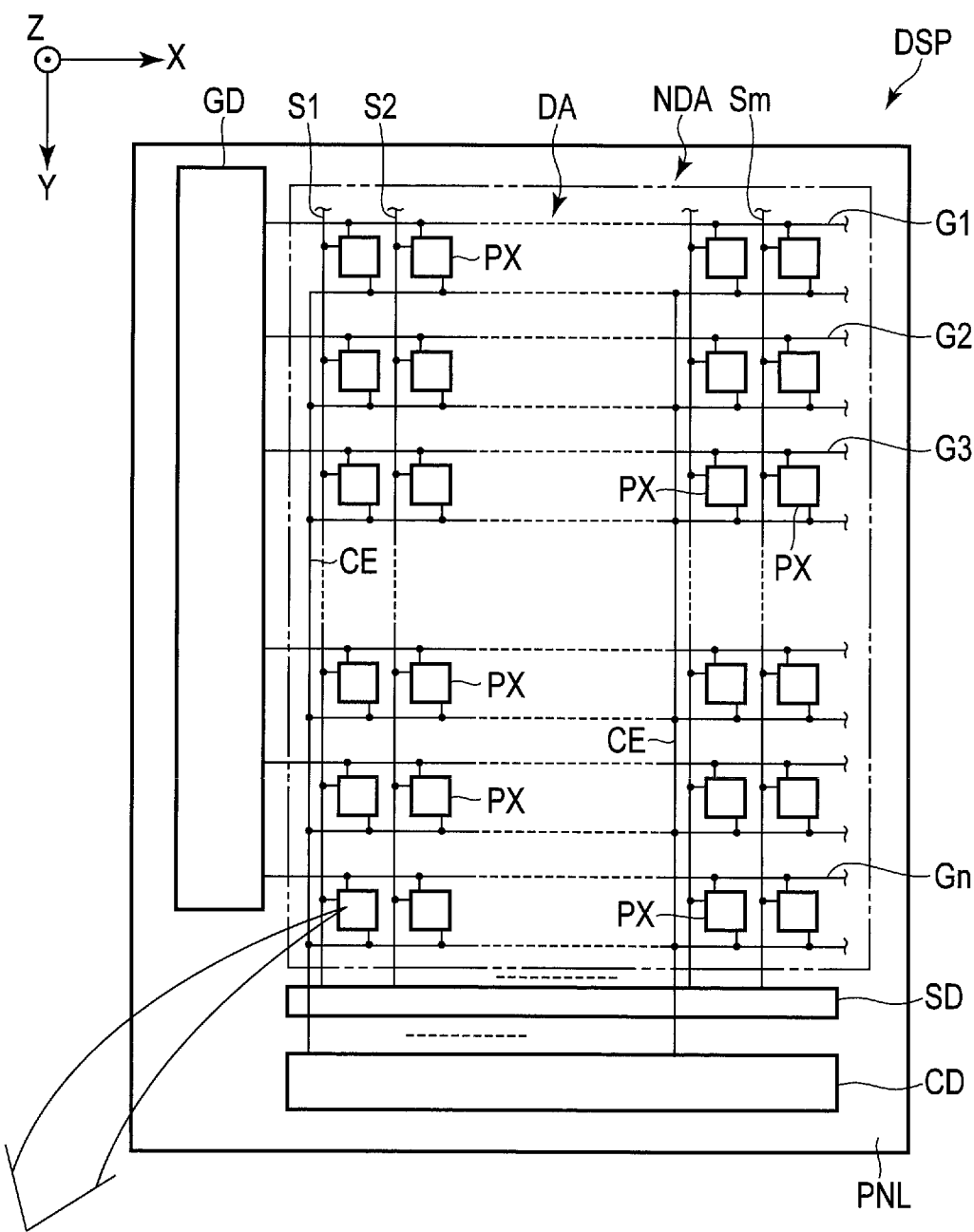
FIG. 9 is a diagram showing the basic structure and the equivalent circuit of a display panel shown in FIG. 8.
Figure 9:
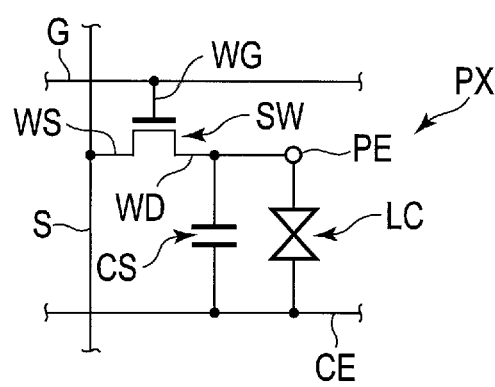

FIG. 9 is a diagram showing the base structure and the equivalent circuit of the display panel PNL shown in FIG. 8.

The display panel PNL includes a plurality of pixels PX in the display area DA. Here, the pixel indicates a minimum unit which is individually controllable according to a pixel signal, and is provided, for example, in an area which includes a switching element provided in a position in which a scanning line and a signal line, which will be described later, cross each other. The pixels PX are arranged in a matrix in the first direction X and the second direction Y. Further, the display panel PNL includes scanning lines G (G1 to Gn), signal lines S (S1 to Sm), a common electrode CE, and the like in the display area DA. The scanning lines G extend in the first direction X and are arranged in the second direction Y. The signal lines S extend in the second direction Y and are arranged in the first direction X. The scanning line G and the signal line S do not necessarily extend linearly but may be partially bent. The common electrode CE is disposed over the pixels PX. The scanning line G, the signal line S, and the common electrode CE are drawn to the non-display area NDA. In the non-display area NDA, the scanning line G is connected to the scanning line drive circuit GD, the signal line S is connected to the signal line drive circuit SD, and the common electrode CE is connected to the common electrode drive circuit CD. The signal line drive circuit SD, the scanning line drive circuit GD, and the common electrode drive circuit CD may be formed on the first substrate SUB1 or may be partially or entirely incorporated in the IC chip I1 shown in FIG. 8.

Each pixel PX includes a switching element SW, a pixel electrode PE, the common electrode CE, the liquid crystal layer LC and the like. The switching element SW is composed of, for example, a thin-film transistor (TFT) and is electrically connected to the scanning line G and the signal line S. More specifically, the switching element SW includes a gate electrode WG, a source electrode WS, and a drain electrode WD. The gate electrode WG is electrically connected to the scanning line G. In the example illustrated, an electrode electrically connected to the signal line S is referred to as the source electrode WS, and an electrode electrically connected to the pixel electrode PE is referred to as the drain electrode WD.

The scanning line G is connected to the switching element SW of each of the pixels PX which are arranged in the first direction X. The signal line S is connected to the switching element SW of each of the pixels PX which are arranged in the second direction Y. Each pixel electrode PE is opposed to the common electrode CE, and drives the liquid crystal layer LC by an electric field which is produced between the pixel electrode PE and the common electrode CE. A storage capacitor CS is formed, for example, between the common electrode CE and the pixel electrode PE.

FIG. 10 is a sectional view showing a part of the structure of the display panel PNL shown in FIG. 8. Here, the drawing shows a cross-section of the display device DSP taken along the first direction X.

The illustrated display device DSP has a structure conforming to a display mode mainly using a lateral electric field which is substantially parallel to a substrate surface. Note that the display panel PNL may have a structure conforming to a display mode using a longitudinal electric field which is perpendicular to a substrate surface, an electric field which is oblique to a substrate surface, or a combination thereof. In the display mode using the lateral electric field, for example, it is possible to apply such a structure where the first substrate SUB1 or the second substrate SUB2 includes both the pixel electrode PE and the common electrode CE. In the display mode using the longitudinal electric field or the oblique electric field, for example, it is possible to apply such a structure where the first substrate SUB1 includes one of the pixel electrode PE and the common electrode CE, and the second substrate includes the other of the pixel electrode PE and the common electrode CE. Note that the substrate surface here is a surface parallel to the X-Y plane.

The first substrate SUB1 includes the first basement 10, the signal line S, the common electrode CE, a metal layer M, the pixel electrode PE, a first insulating layer 11, a second insulating layer 12, a third insulating layer 13, a first alignment film AL1, and the like. Here, the switching element and the scanning line, various insulating layers interposed therebetween, and the like are not illustrated.

The first insulating layer 11 is located above the first basement 10. The scanning line and the semiconductor layer of the switching element (not shown) are located between the first basement 10 and the first insulating layer 11. The signal line S is located above the first insulating layer 11. The second insulating layer 12 is located above the signal line S and the first insulating layer 11. The common electrode CE is located above the second insulating layer 12. The metal layer M is in contact with the common electrode directly above the signal line S. In the example illustrated, the metal layer M is located above the common electrode CE but may be located between the common electrode CE and the second insulating layer 12 instead. The third insulating layer 13 is located above the common electrode CE and the metal layer M. The pixel electrode PE is located above the third insulating layer 13. The pixel electrode PE is opposed to the common electrode CE via the third insulating layer 13. Further, the pixel electrode PE has a slit SL in a position which is opposed to the common electrode CE. The first alignment film AL1 covers the pixel electrode PE and the third insulating layer 13.

Each of the scanning line G, the signal line S, and the metal layer M may be formed of a metal material such as molybdenum, tungsten, titanium or aluminum, and may have a single layer structure or a multilayer structure. Each of the common electrode CE and the pixel electrode PE is formed of a transparent conductive material such as ITO or IZO. The first insulating layer 11 and the third insulating layer 13 are inorganic insulating layers, and the second insulating layer 12 is an organic insulating layer.

Note that the structure of the first substrate SUB1 is not limited to the example shown in the drawing, and that the pixel electrode PE may be located between the second insulating layer 12 and the third insulating layer 13, and the common electrode CE may be located between the third insulating layer 13 and the first alignment film AL1. In this case, the pixel electrode PE has the shape of a flat plate which does not have any slit, and the common electrode CE has a slit which is opposed to the pixel electrode PE. Further, both the pixel electrode PE and the common electrode CE may have the shape of a comb and may be arranged in such a manner as to be engaged with each other.

The second substrate SUB2 includes the second basement 20, a light-shielding layer BM, a color filter CF, an overcoat layer OC, a second alignment film AL2, and the like.

The light-shielding layer BM and the color filter CF are located on one side of the second basement 20 which is opposed to the first substrate SUB1. The light-shielding layer BM delimits the pixels and is located directly above the signal lines S. The color filter CF is opposed to the pixel electrode PE and partially overlaps the light-shielding layer BM. The color filter CF includes a red color filter, a green color filter, a blue color filter, and the like. The overcoat layer OC covers the color filter CF. The second alignment film AL2 covers the overcoat layer OC.

Note that the color filter CF may be disposed on the first substrate SUB1. The color filter CF may include color filters of four or more colors. In the pixel which displays white color, it is possible to provide a white color filter or an uncolored resin material or it is also possible to provide the overcoat layer OC without any color filter.

The detection electrode Rx is located on the second surface 20B of the second basement 20. The detection electrode Rx corresponds to the second conductive layer L2 as described above, and may be formed of a metal-containing conductive layer or a transparent conductive material such as ITO or IZO, may be a multilayer in which a transparent conductive layer is stacked on a metal-containing conductive layer, or may be formed of a conductive organic material, a dispersion element of a fine conductive substance, or the like.

A first optical element OD1 including a first polarizer PL1 is located between the first basement 10 and the illumination device BL. A second optical element OD2 including a second polarizer PL2 is located on the detection electrode Rx. Each of the first optical element OD1 and the second optical element OD2 may include a retardation film as needed.

Next, a structural example of the sensor SS which is to be provided in the display device DSP of the present embodiment will be described. The sensor SS which will be described below is, for example, a mutual-capacitance sensor which detects contact or approach of an object to be detected based on a change in capacitance between a pair of electrodes which are opposed to each other via a dielectric interposed therebetween.

Figure 11:
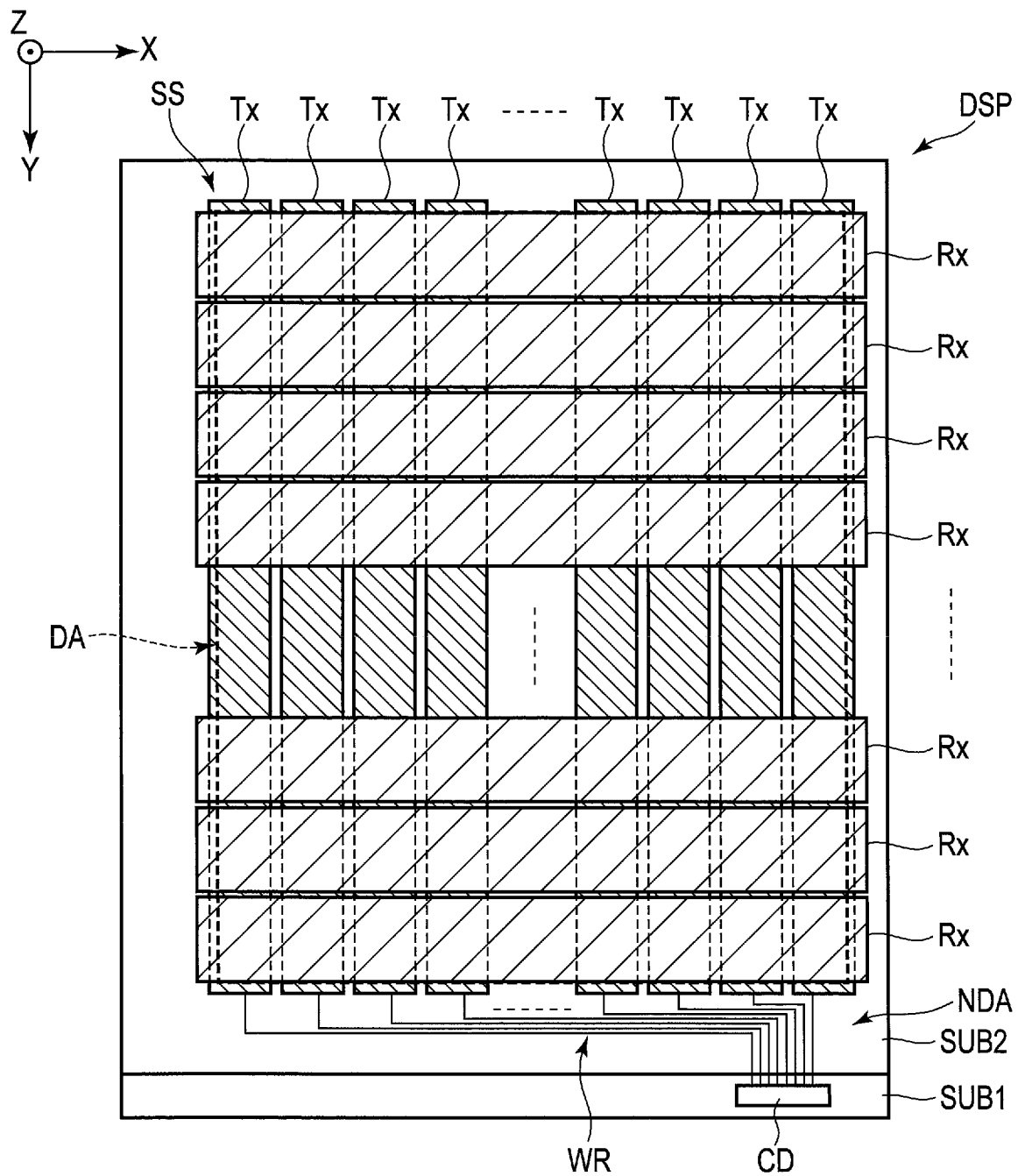
FIG. 11 is a plan view showing a structural example of a sensor of one embodiment.

FIG. 11 is a plan view showing a structural example of the sensor SS.

In the structural example illustrated, the sensor SS includes a sensor driving electrode Tx and the detection electrode Rx. The sensor driving electrode Tx corresponds to an area diagonally shaded with falling diagonal lines, and is provided on the first substrate SUB1. Further, the detection electrode Rx corresponds to an area diagonally shaded with rising diagonal lines, and is provided on the second substrate SUB2. The sensor driving electrode Tx and the detection electrode Rx cross each other in the X-Y plane. The detection electrode Rx is opposed to the sensor driving electrode Tx in the third direction Z.

The sensor driving electrode Tx and the detection electrode Rx are located in the display area DA and partially extend in the non-display area NDA. In the example illustrated, the sensor driving electrodes Tx are strip-shaped and elongated in the second direction Y, and are arranged in the first direction X at intervals. The detection electrodes Rx extend in the first direction X and are arranged in the second direction Y at intervals. As described with reference to FIG. 8, the detection electrode Rx is connected to the pad provided in the first substrate SUB1 and is electrically connected to the detection circuit RC via a wire. Each sensor driving electrode Tx is electrically connected to the common electrode drive circuit CD via a wire WR. Note that the number, size, and shape of each of the sensor driving electrode Tx and the detection electrode Rx are not limited to any particular number, size, and shape and can be modified in various ways.

The sensor driving electrode Tx includes the above-described common electrode CE, and has a function of producing an electric field between the common electrode CE and the pixel electrode PE and a function of detecting the position of an object to be detected by producing capacitance between the common electrode CE and the detection electrode Rx.

At a display drive time when an image is to be displayed on the display area DA, the common electrode drive circuit CD supplies a common drive signal to the sensor driving electrode Tx including the common electrode CE. At a sensing drive time when sensing is to be executed, the common electrode drive circuit CD supplies a sensor drive signal to the sensor driving electrode Tx. As the sensor drive signal is supplied to the sensor driving electrode Tx, the detection electrode Rx outputs a sensor signal necessary for sensing (that is, a signal based on a change in inter-electrode capacitance between the sensor driving electrode Tx and the detection electrode Rx). A detection signal output from the detection electrode Rx is input to the detection circuit RC shown in FIG. 8.

Note that the sensor SS in each structural example is not limited to a mutual-capacitance sensor which detects an object to be detected based on a change in capacitance between a pair of electrodes (capacitance between the sensor driving electrodes Tx and the detection electrode Rx in the above-described example), and may be a self-capacitance sensor which detects an object to be detected based on a change in capacitance of the detection electrode Rx itself.

FIG. 12 is a diagram showing a structural example of the detector RS of the detection electrode Rx1 shown in FIG. 8.

In the example shown in FIG. 12(A), the detector RS is formed of a mesh of metal wires MS. The metal wires MS are connected to the terminal RT1. In the example shown in FIG. 12(B), the detector RS is formed of wavelike metal wires MW. In the example illustrated, the metal wire MW has the shape of a saw-tooth but may have another shape such as the shape of a sinusoidal wave. The metal wires MW are connected to the terminal RT1.

The terminal RT1 is formed of, for example, the same material as that of the detector RS. The round contact hole V1 is formed in the terminal RT1.

Figure 13:
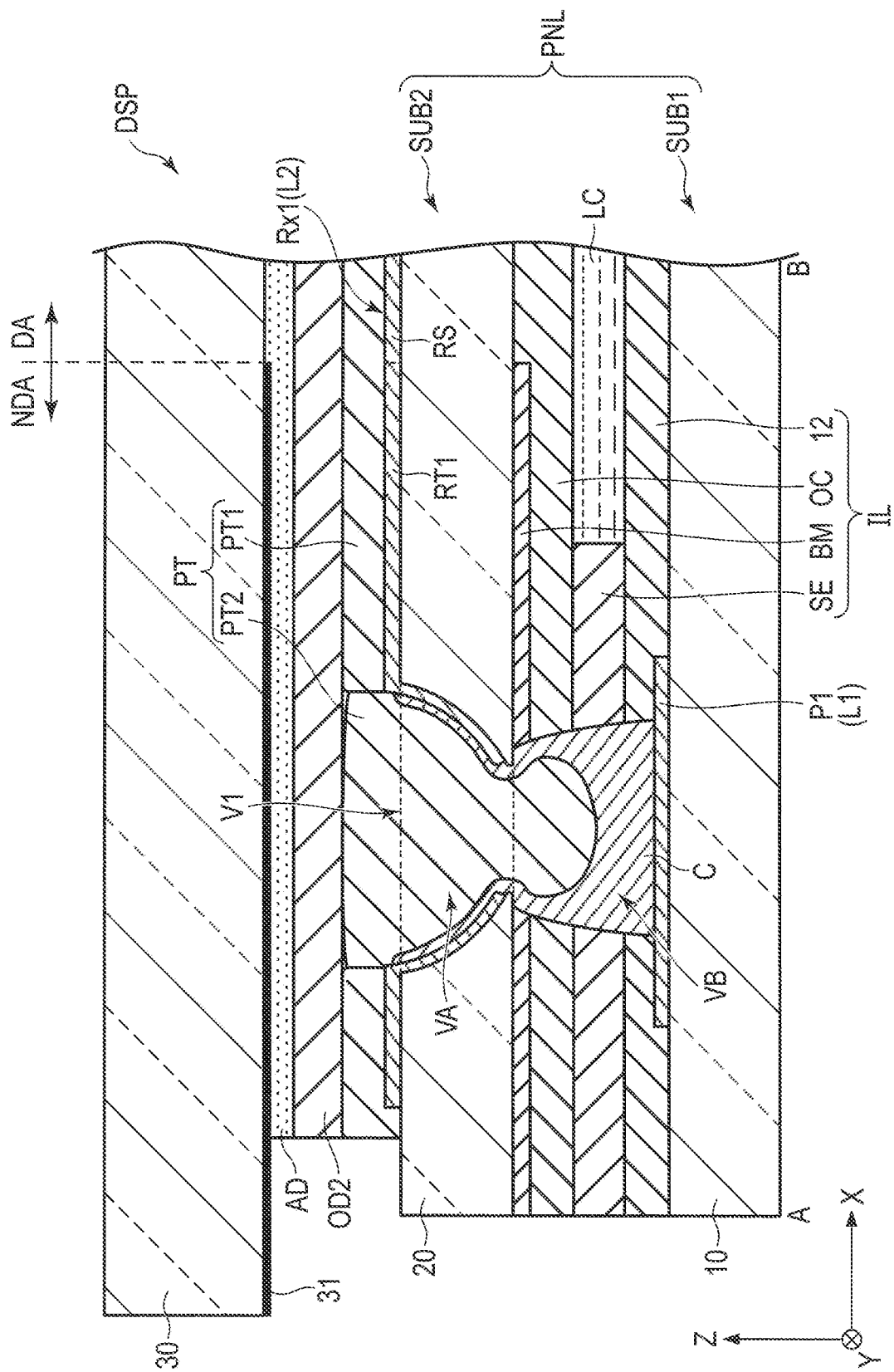
FIG. 13 is a sectional view of the display device taken along line A-B of FIG. 8.

FIG. 13 is a sectional view showing a structural example of the display device DSP taken along line A-B crossing the contact hole V1 shown in FIG. 8. Here, only the main structural elements necessary for explanation are illustrated. Further, although the structure shown in FIG. 3 is applied to the contact hole V1, each of the structures shown in FIGS. 1 and 4 to 7 can also be applied to the contact hole V1.

The first substrate SUB1 includes the first basement 10, the pad P1 corresponding to the first conductive layer L1, the second insulating layer 12, and the like. The first insulating layer 11 shown in FIG. 10 or various other insulating layers or conductive layers may be disposed between the first basement 10 and the pad P1 or between the first basement 10 and the second insulating layer 12. The second substrate SUB2 includes the second basement 20, the detection electrode Rx1 corresponding to the second conductive layer L2, the light-shielding layer BM, the overcoat layer OC, and the like.

The sealing material SE is located between the second insulating layer 12 and the overcoat layer OC. The liquid crystal layer LC is located between the first substrate SUB1 and the second substrate SUB2. Note that, although not illustrated in the drawing, the metal layer M, the third insulating layer 13, and the first alignment film AL1 shown in FIG. 10 may be interposed between the second insulating layer 12 and the sealing material SE. Further, the second alignment film AL2 shown in FIG. 10 may be interposed between the overcoat layer OC and the sealing material SE.

The sealing material SE, the second insulating layer 12, the light-shielding layer BM, and the overcoat layer OC constitute the above-described insulating layer IL (organic insulating layer). The insulating layer IL may also include other layers such as the first alignment film AL1 and the second alignment film AL2. Further, the insulating layer IL may not include any one of the sealing material SE, the second insulating layer 12, the light-shielding layer BM, and the overcoat layer OC. For example, the insulating layer IL may be composed only of the sealing material SE.

The contact hole V1 includes the hole VA which penetrates the second basement 20, and the hole VB which penetrates the insulating layer IL. The hole VB penetrates the sealing material SE, the second insulating layer 12, the light-shielding BM, and the overcoat layer OC, which constitute the insulating layer IL. The connecting material C electrically connects the pad P1 and the detection electrode Rx to each other. The detector RS and the terminal RT1 of the detection electrode Rx1 are at least partially covered with the first protection layer PT1. The connecting material C is covered with the second protection layer PT2.

The second optical element OD2 is disposed above the protection layer PT which includes the first protection layer PT1 and the second protection layer PT2. Further, a cover glass 30 (cover member) is attached to the second optical element OD2 via an adhesive layer AD. In the non-display area NDA, a decorative layer 31 (light-shielding layer) is formed on the display panel PNL side of the cover glass 30. The decorative layer 31 is not formed in the display area DA. As the cover glass 30 is provided, unevenness resulting from the contact hole V1 will not show up on the outer surface of the display device DSP. Further, since the decorative layer 31 is provided, the contact hole V1 will not be seen from the outside.

According to the display device DSP equipped with the above-described sensor SS, the detection electrode Rx provided on the second substrate SUB2 is connected to the pad P provided on the first substrate SUB1 by the connecting material C provided in the contact hole V. Therefore, there is no need to mount a wiring substrate for connecting the detection electrode Rx and the detection circuit RC, on the second substrate SUB2. That is, the wiring substrate SUB3 mounted on the first substrate SUB1 forms a transmission path for transmitting a signal necessary for displaying an image on the display panel PNL and also forms a transmission path for transmitting a signal between the detection electrode Rx and the detection circuit RC. Therefore, as compared to a structural example which requires another separate wiring substrate in addition to the wiring substrate SUB3, the number of wiring substrates can be reduced, and costs can be reduced. Further, since there is no need to secure a space for connecting a wiring substrate to the second substrate SUB2, the width of the non-display area of the display panel PNL, in particular, the width of an edge where the wiring substrate SUB3 is mounted can be reduced. Therefore, it is possible to achieve a narrow frame and low cost.

Next, an example of the manufacturing method of the display device DSP shown in FIG. 13 will be described with reference to FIGS. 14 to 23.

Figure 14:
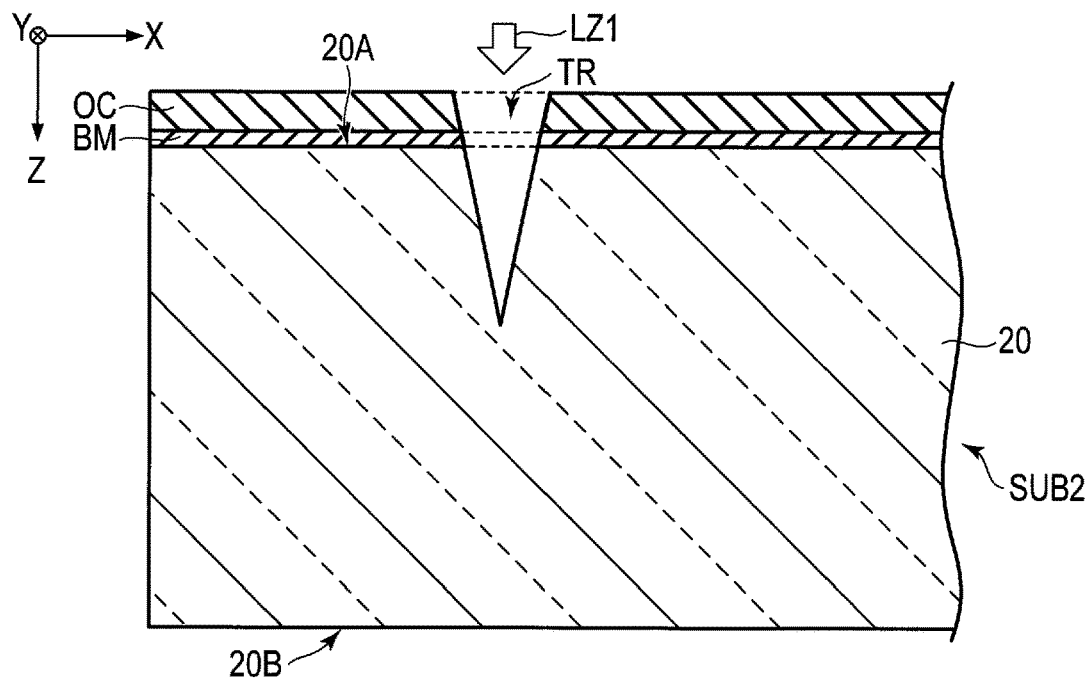
FIG. 14 is a diagram showing a manufacturing method of the display device of one embodiment.

Firstly, the first substrate SUB1 and the second substrate SUB2 on which the elements shown in FIG. 10 are formed are prepared. Then, as shown in FIG. 14, a recess TR is formed in a position in which the contact hole V1 is to be formed in the second substrate SUB2. The recess TR penetrates the overcoat layer OC and the light-shielding layer BM and reaches the second basement 20, but does not penetrate the second basement 20. For example, the recess TR has the shape of a cone which tapers toward the tip in the second basement 20 from the opening in the overcoat layer OC.

It is possible to form this recess TR, for example, by irradiating laser light LZ1 from above the overcoat layer OC. As the laser light source, for example, a carbon dioxide gas laser device may be adopted, but any laser device is adoptable as long as the laser device can drill a glass material and an organic material, and an excimer laser device or the like is also adoptable. The intensity profile of the laser light LZ1 in the X-Y plane has, for example, a Gaussian shape such that the intensity increases toward the center as shown in FIG. 23(A).

Figure 15:
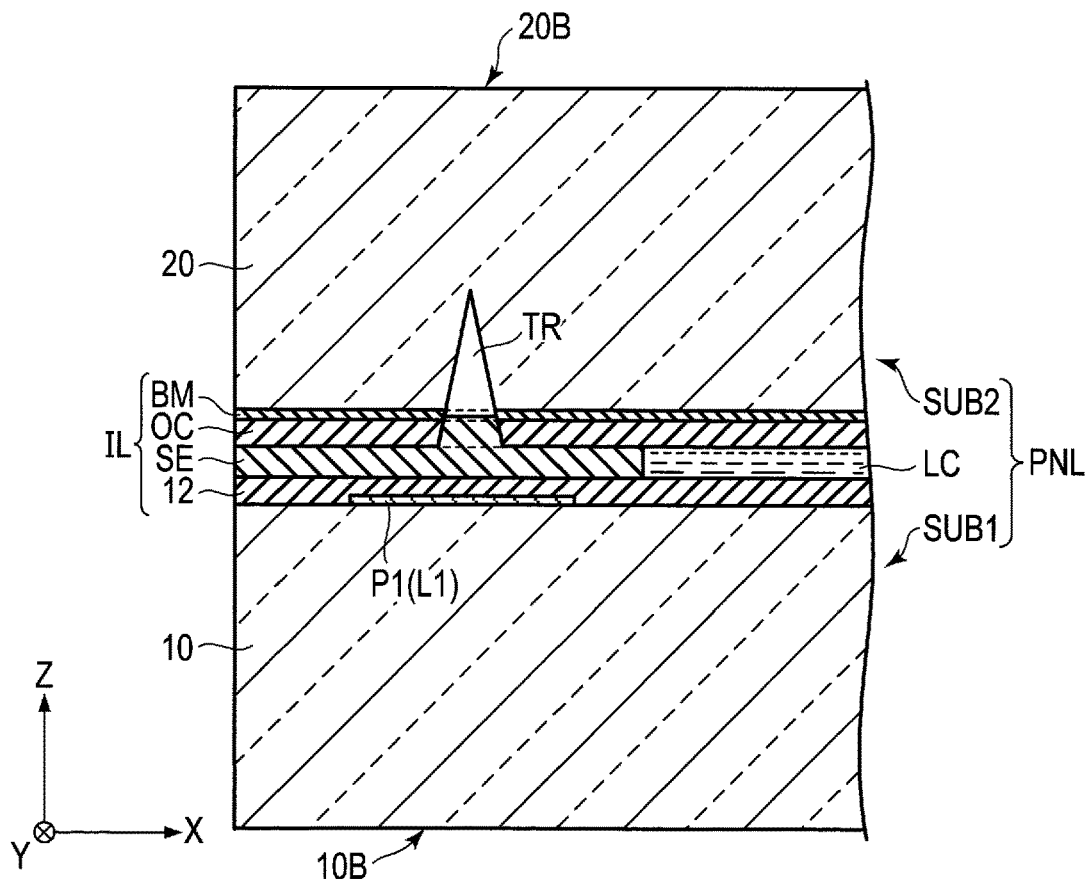
FIG. 15 is a diagram showing the manufacturing method of the display device of one embodiment.

Then, the sealing material SE is formed along the edges of either the first substrate SUB1 or the second substrate SUB2, a liquid crystal material is dropped on the inside of the sealing material SE, and the first substrate SUB1 and the second substrate SUB2 are attached to each other. In this way, as shown in FIG. 15, the display panel PNL where the liquid crystal layer LC is formed between the first substrate SUB1 and the second substrate SUB2 can be obtained. Note that a part of the sealing material SE enters the recess TR.

Subsequently, the first basement 10 and the second basement 20 are reduced in thickness by means of an etching solution such as hydrofluoric acid (HF). FIGS. 16 to 18 show this thickness reduction process. In a state shown in FIG. 16, the thickness of the second basement 20 is reduced to the extent that the tip of the recess TR reaches the second surface 20B. In a state shown in FIG. 17, the recess TR opens on the second surface 20B, and the hole VA is formed. In the vicinity of the recess TR, since the contact area between the etching solution and the second basement 20 is large, corrosion tends to progress. Accordingly, the hole VA has such a shape that the hole VA includes the first portion VA1 on the first surface 20A side and the bowl-like second portion VA2 on the second surface 20B side. As the thickness is further reduced, the first portion VA1 disappears, and the hole VA which has the shape of a bowl as a whole will be formed as shown in FIG. 18.

In the process of forming the recess TR by the laser light LZ1, even if small cracks occur near the second surface 20B of the second basement 20, the cracks can be removed by the thickness reduction process. Therefore, the thickness reduction process can reduce the thickness of the display panel PNL and also prevent the decrease of strength associated with the cracks.

After the thickness reduction process, as shown in FIG. 19, the hole VB which penetrates the light-shielding layer BM, the overcoat layer OC, the sealing material SE, and the second insulating layer 12 is formed. It is possible to form this hole VB, for example, by irradiating laser light LZ2 via the hole VA. The intensity profile of the laser light LZ2 in the X-Y plane has, for example, a top-hat shape such that the intensity is generally flat as shown in FIG. 23(B). The intensity of the laser light LZ2 is generally lower than the intensity of the center of the laser light LZ1, and is not so high as to increase the temperature of at least the pad P1 (first conductive layer L1) to the melting point. Therefore, no hole is formed in the pad P1 by the laser light LZ2.

In this process of forming the hole VB by the laser light LZ2, the light-shielding layer BM, the overcoat layer OC, the sealing material SE, the second insulating layer 12, and the second basement 20 are melted, residues thereof will be produced. To removed these residues, for example, desmear treatment using microwave plasma should preferably be applied. In the hole VB which is formed after the laser light LZ2 and the desmear treatment are applied, the third opening O3 on the first conductive layer L1 side is larger than the fourth opening O4 on the second basement 20 side as shown in FIG. 19.

Figure 20:
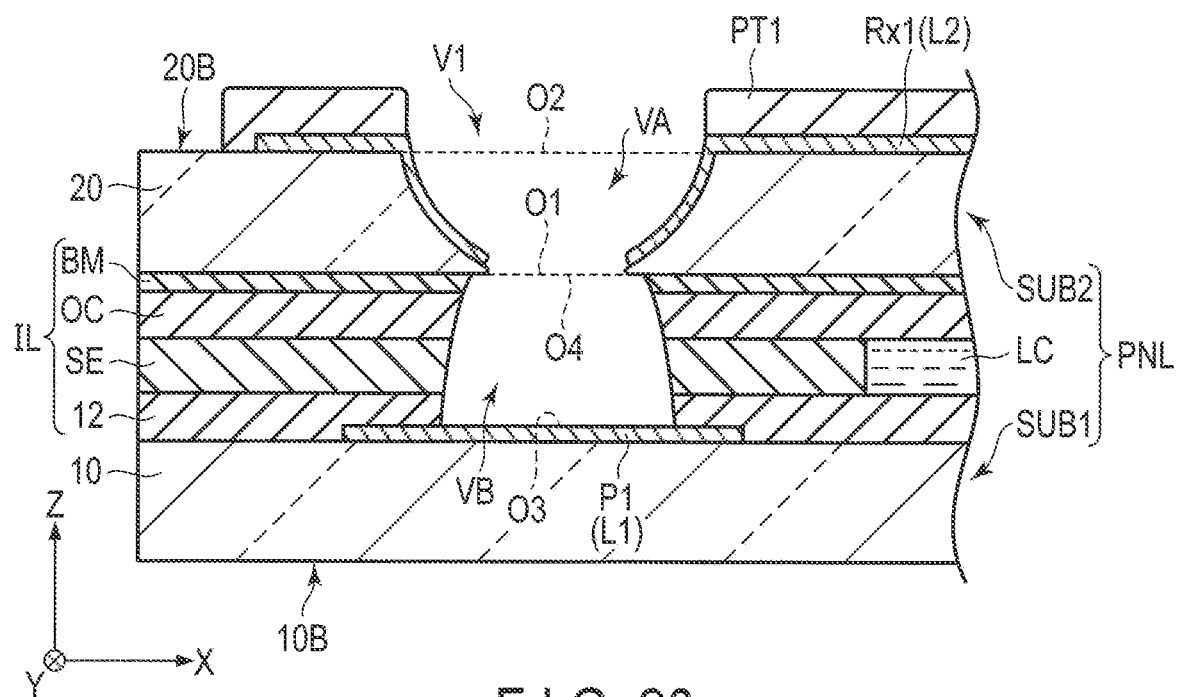
FIG. 20 is a diagram showing the manufacturing method of the display device of one embodiment.

Then, as shown in FIG. 20, the detection electrode Rx1 (second conductive layer L2) is formed above the second surface 20B of the second basement 20. Further, the first protection layer PT1 is provided over the detection electrode Rx1. The first protection layer PT1 may be formed in the hole VA and the hole VB, but after an etching process or the like is applied, the first protection layer PT1 is removed in a state shown in FIG. 20. Therefore, the detection electrode Rx is exposed inside the hole VA. Note that the detection electrode Rx may be formed in such a manner as to entirely cover the inside of the hole VA or may also be formed in such a manner as to partially cover the inside of the hole VA.

Figure 21:
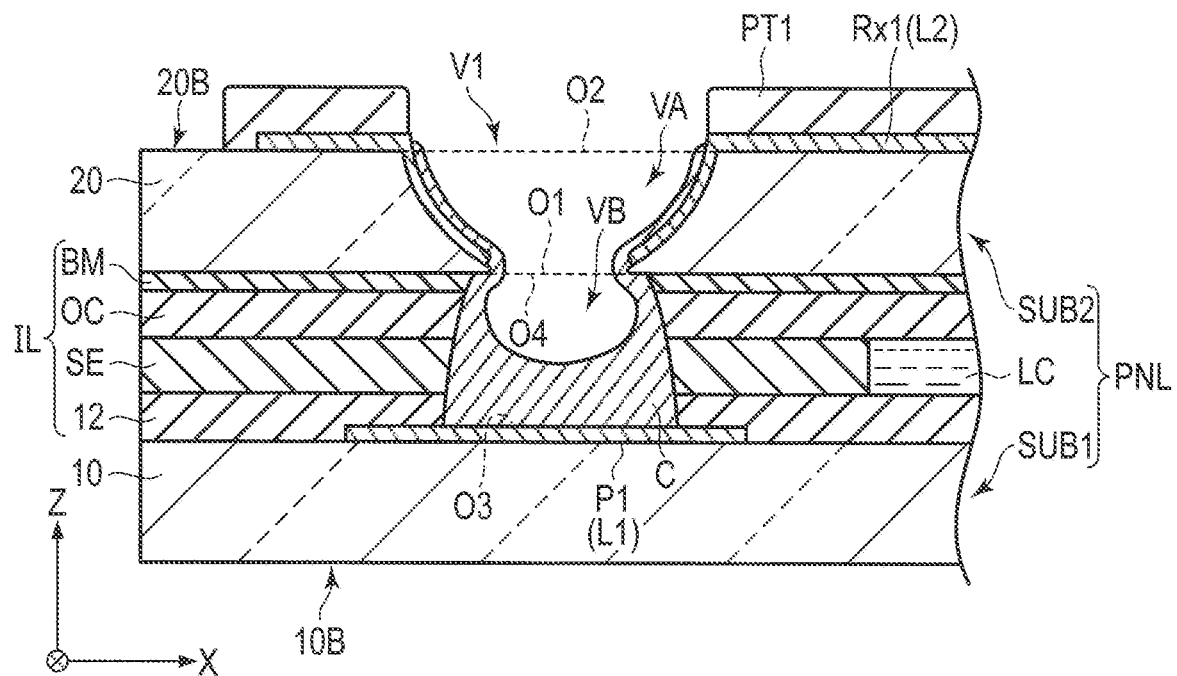
FIG. 21 is a diagram showing the manufacturing method of the display device of one embodiment.

Then, the connecting material C is formed as shown in FIG. 21. In this process, for example, in a vacuum environment, the connecting material C including a solvent is injected into the contact hole V1, and the contact hole V1 is filled with the connecting material C. After that, as the solvent is removed, the volume of the connecting material C is reduced, and the connecting material C which covers the pad P1, the detection electrode Rx1, the inner surface F2 of the hole VB, and the like and has a hollow will be formed.

Figure 22:
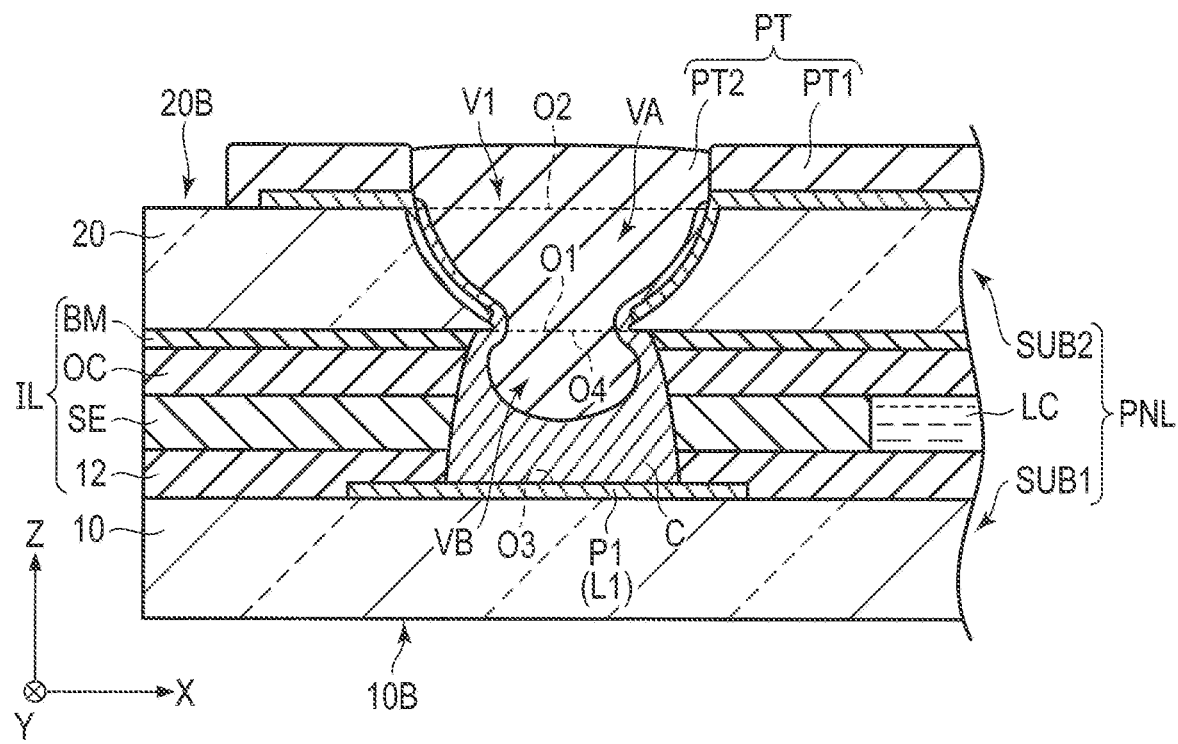
FIG. 22 is a diagram showing the manufacturing method of the display device of one embodiment.
Figure 23:
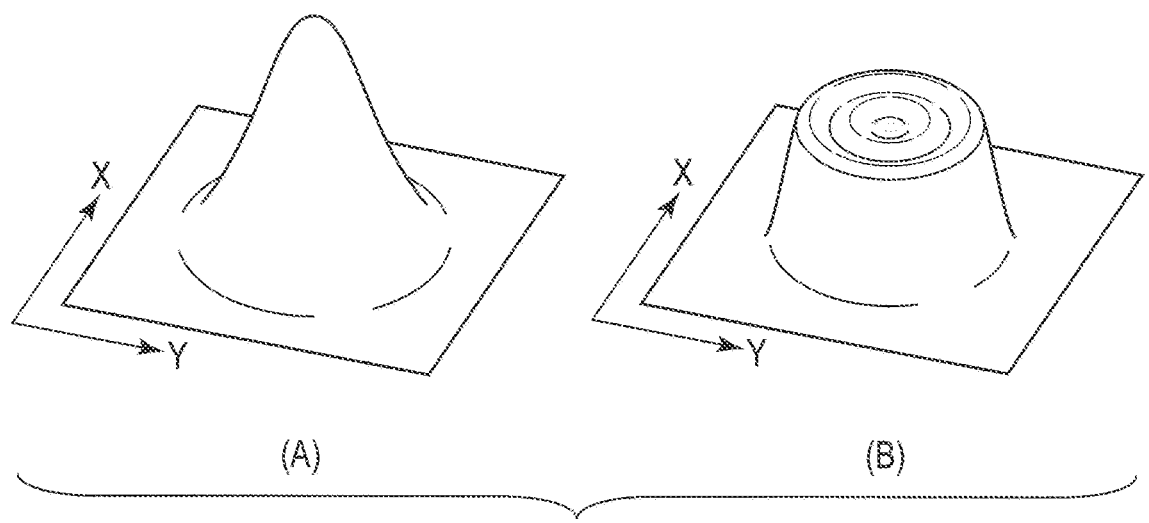
FIG. 23 is a diagram showing the intensity profile of laser light of one embodiment.

Then, the second protection layer PT2 which covers the connecting material C is formed as shown in FIG. 22. In this way, the display panel PNL shown in FIG. 13 is produced. Further, as the first optical element OD1, the second optical element OD2, the cover glass 30, the illumination device BL, and the like are fixed to this display panel PNL, the display device DSP will be produced.

In the above description, the manufacturing method of the contact hole V1 has been mainly described, but the other contact holes V will be formed in the same process. In general, to manufacture the display panel PNL, for example, a plurality of first substrates SUB1 are formed on a large-size mother glass (first basement 10), and a plurality of second substrates SUB2 are similarly formed on a large-size mother glass (second basement 20), and after they are attached to each other, they are cut into the shapes of individual display panels PNL. The above-described manufacturing method is also applicable to this manufacturing process of the display panel PNL.

In the case of stopping the thickness reduction process of the second basement 20, for example in the state shown in FIG. 17, it is possible to manufacture the display device DSP having the contact hole V where the hole VA includes the first portion VA1 and the second portion VA2 as shown in FIG. 4. Further, in the case of stopping the thickness reduction process of the second basement 20 in a state before the state shown in FIG. 17, it is possible to manufacture the display device DSP having the contact hole V where the first opening O1 is larger than the second opening O2 in the hole VA as shown in FIG. 1.

Next, another manufacturing method of the display device DSP will be described based on the assumption that the contact hole V1 shown in FIG. 13 has the structure shown in FIG. 6.

The process of forming the contact hole V1 is the same as that of the previously-described example shown in FIGS. 14 to 19. In this example, after the contact hole V1 such as that shown in FIG. 19 is formed, the contacting material C is formed inside the contact hole V1 as shown in FIG. 24.

Figure 25:
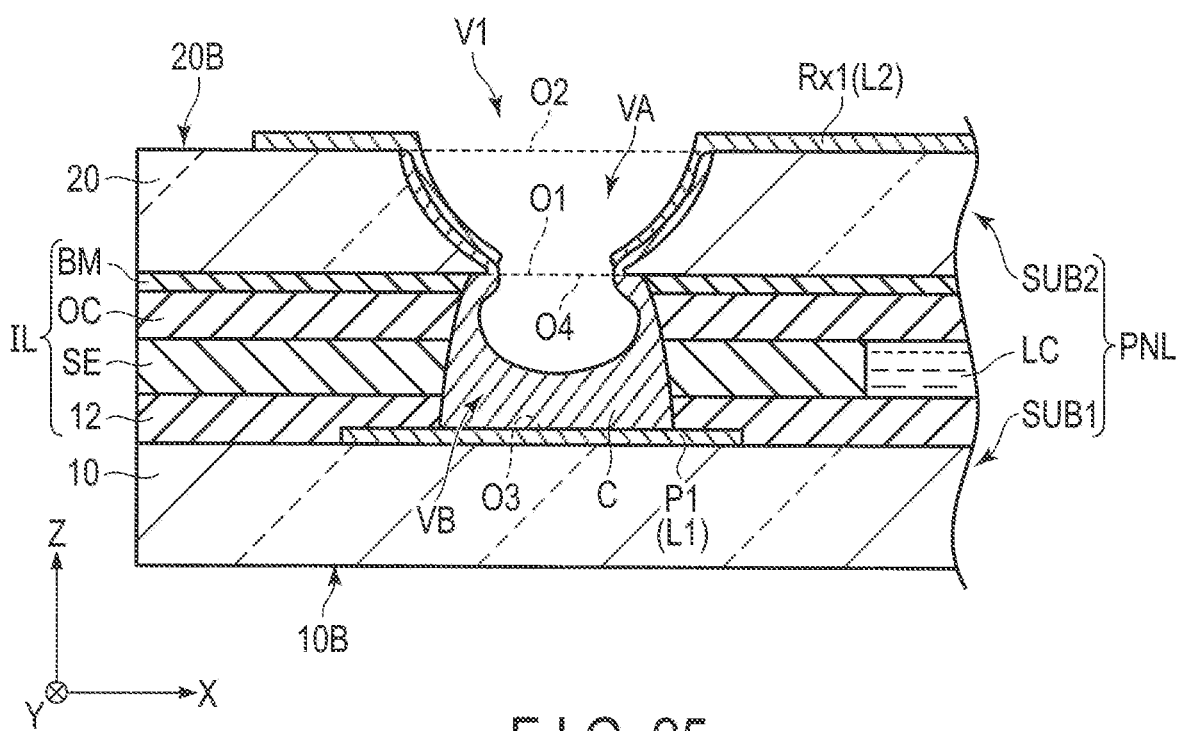
FIG. 25 is a diagram showing another manufacturing method of the display device of one embodiment.

Then, the detection electrode Rx1 (second conductive layer L2) is formed on the second surface 20B of the second basement 20 as shown in FIG. 25. The detection electrode Rx1 is also formed inside the hole VA and covers a part of the connecting material C. Then, the protection layer PT which covers the detection electrode Rx1 and the connecting material C is formed as shown in FIG. 26.

In the previously-described manufacturing method, it is necessary to remove the first protection layer PT1 in the position of each contact hole V and form the second protection layer PT2 individually with respect to each contact hole V. However, in the manufacturing method shown in FIGS. 24 to 26, since the protection layer PT which covers each contact hole V can be formed collectively, the number of processes can be reduced. Further, in the above-described manufacturing process using the mother glass, since the protection layers PT of a plurality of display panels PNL can be easily formed in one process, the manufacturing method is particularly advantageous and can contribute to a larger mother glass.

Figure 24:
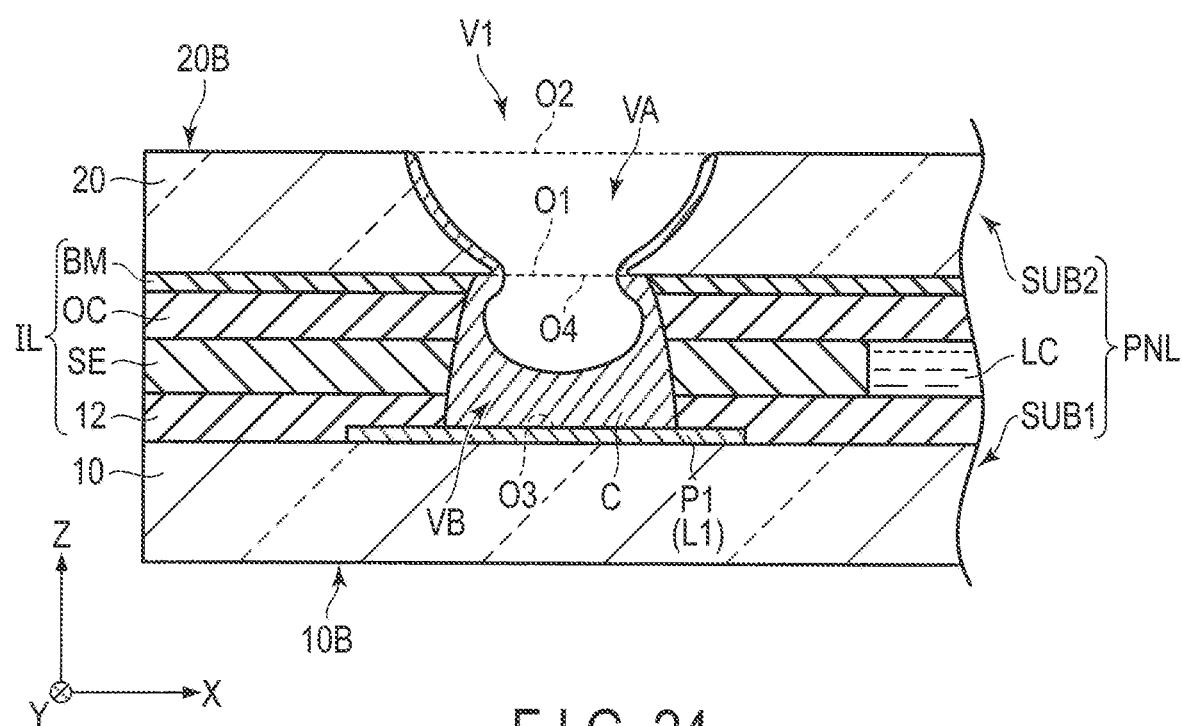
FIG. 24 is a diagram showing another manufacturing method of the display device of one embodiment.
Figure 26:
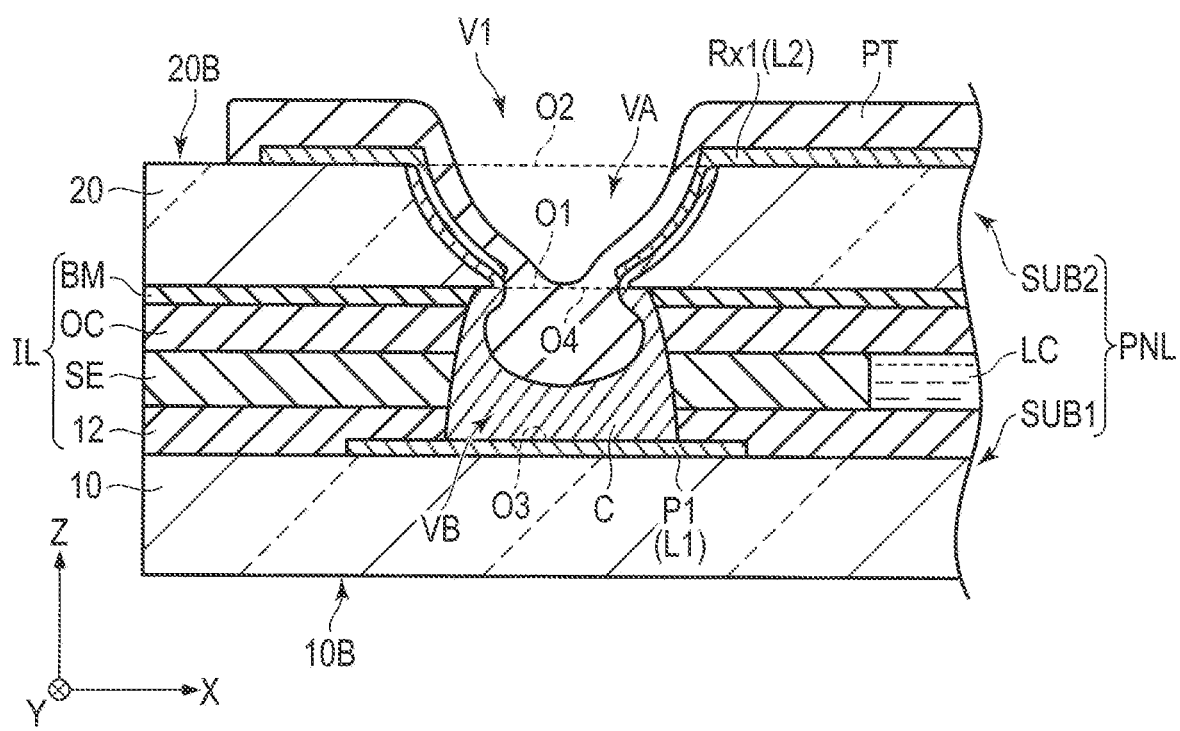
FIG. 26 is a diagram showing another manufacturing method of the display device of one embodiment.

According to the manufacturing method shown in FIGS. 24 to 26, in the case of stopping the thickness reduction of the second basement 20 in the state shown in FIG. 17, it is possible to manufacture the display device DSP having the contact hole V where the hole VA includes the first portion VA1 and the second portion VA2 as shown in FIG. 7. Further, in the case of stopping the thickness reduction process of the second basement 20 in a state before the state shown in FIG. 17, it is possible to manufacture the display device DSP having the contact hole V where the first opening O1 is larger than the second opening O2 in the hole VA as shown in FIG. 5.

As described above, according to the present embodiment, a display device and a manufacturing of the same which can narrow a frame and reduce costs can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Examples of the display device which are obtained from the structure disclosed in the detailed description will be additional described below.

(1) An electronic device comprising:
a first substrate which includes a first conductive layer;
a second substrate which includes
a basement which has
a first surface opposed to the first conductive layer and separated from the first conductive layer, and
a second surface opposite to the first surface,
a second conductive layer which is arranged on the second surface, and
a first hole which penetrates through between the first surface and the second surface;
an insulating layer which is arranged between the first conductive layer and the basement, and has a second hole which is connected to the first hole; and
a connecting material which electrically connects the first conductive layer and the second conductive layer via the first hole and the second hole, wherein
the first hole has a first opening on a first surface side and a second opening on a second surface side,
the second hole has a third opening on a first conductive layer side and a fourth opening on a basement side, and
the third opening is larger than the first opening.

(2) The electronic device according to (1), wherein the second hole has a shape that a width increases from the fourth opening to the third opening in a sectional view.

(3) The electronic device according to (1), wherein
the first conductive layer has a flat area which closes the third opening, and
the connecting material is in contact with the area.

(4) The electronic device according to (1), wherein the insulating layer includes a sealing material which attaches the first substrate and the second substrate to each other.

(5) The electronic device of according to (1), wherein the fourth opening is larger than the first opening.

(6) The electronic device according to (1), wherein the first opening is larger than the second opening.

(7) The electronic device according to (1), wherein the first opening is smaller than the second opening.

(8) The electronic device according to (1), wherein the first hole has a shape that a width increases from the first opening toward the second opening in a sectional view.

(9) The electronic device according to (1), wherein the first hole has an intermediate portion which is located between the first opening and the second opening, and the first hole has a shape that a width decreases from the first opening toward the intermediate portion and increases from the intermediate portion toward the second opening in a sectional view.

(10) The electronic device according to (9), wherein the first opening is smaller than the second opening.

(11) The electronic device according to (1), wherein the connecting material covers an inner surface of the first hole and an inner surface of the second hole.

(12) The electronic device according to (1), wherein the connecting material covers the second surface and the second conductive layer covers the connecting material in a circumference of the first hole.

(13) The electronic device according to (1), wherein the connecting material inside the first hole is formed between the second conductive layer and an inner surface of the first hole.

(14) The electronic device according to (1), wherein the second conductive layer inside the first hole is formed between the connecting material and an inner surface of the first hole.

(15) The electronic device according to (1), further comprising a protection layer which covers the second conductive layer and the connecting material.

(16) The electronic device according to (15), wherein the protection layer includes a first protection layer which covers the second conductive layer, and a second protection layer which covers the connecting material.

(17) The electronic device according to (16), wherein the second hole is filled with the second protection layer.

(18) The electronic device according to (1), wherein the second conductive layer includes a detector which detects an object in contact with or in proximity to the first area, and a terminal which is arranged in a second area adjacent to the first area and is connected to the detector, and the first hole and the second hole are located in a position which overlaps the terminal in a plan view.

(19) The electronic device according to (18), further comprising a detection circuit which is electrically connected to the first conductive layer and reads a sensor signal output from the second conductive layer.

(20) The electronic device according to (18), wherein the first substrate includes a driving electrode which is opposed to the second conductive layer.

(21) A manufacturing method of a display device comprising:

preparing a first substrate which includes a first conductive layer, and a second substrate which includes a basement having a first surface and a second surface opposite to the first surface;

forming a recess on the first surface of the basement;

opposing the first conductive layer and the first surface to each other, and attaching the first substrate and the second substrate to each other with an insulating layer arranged between the first substrate and the second substrate;

forming a first hole which penetrates through between the first surface and the second surface by reducing a thickness of the basement and making the recess open on the second surface;

forming a second hole which is connected to the first hole on the insulating layer;

forming a second conductive layer on the second surface; and forming a connecting material which electrically connects the first conductive layer and the second conductive layer to each other via the first hole and the second hole.

(22) The manufacturing method according to (21), wherein the first hole has a first opening on a first surface side, and a second opening on a second surface side, the second hole has a third opening on a first conductive layer side, and a fourth opening on a basement side, and the third opening is larger than the first opening.

(23) The manufacturing method according to (21), further comprising forming a first protection layer which covers the second conductive layer.

(24) The manufacturing method according to (21), further comprising forming a second protection layer which covers the connecting material.

(25) The manufacturing method according to (21), further comprising forming the recess by irradiating first laser light to the first surface.

(26) The manufacturing method according to (21), further comprising forming the second hole by irradiating second laser light to the insulating layer via the first hole.

What is claimed is:

1. An electronic device comprising:

a first substrate which includes a first conductive layer;

a second substrate which includes a basement which has a first surface opposed to the first conductive layer and separated from the first conductive layer, and a second surface opposite to the first surface, a second conductive layer which is arranged on the second surface, and a first hole which penetrates through between the first surface and the second surface; and a connecting material which electrically connects the first conductive layer and the second conductive layer via the first hole, wherein the first hole has a first opening on a first surface side and a second opening on a second surface side, and the first opening is larger than the second opening.

2. The electronic device according to claim 1, wherein the first hole has a shape that a width increases from the first opening toward the second opening in a sectional view.

3. The electronic device according to claim 1, wherein the connecting material covers an inner surface of the first hole and an inner surface of the second hole.

4. The electronic device according to claim 1, wherein the connecting material covers the second surface and the second conductive layer covers the connecting material in a circumference of the first hole.

5. The electronic device according to claim 1, wherein the connecting material inside the first hole is formed between the second conductive layer and an inner surface of the first hole.

6. The electronic device according to claim 1, wherein the second conductive layer inside the first hole is formed between the connecting material and an inner surface of the first hole.

7. The electronic device according to claim 1, further comprising a protection layer which covers the second conductive layer and the connecting material.

8. The electronic device according to claim 7, wherein the protection layer includes a first protection layer which covers the second conductive layer, and a second protection layer which covers the connecting material.

9. The electronic device according to claim 1, wherein the second conductive layer includes
    a detector which detects an object in contact with or in proximity to a first area, and
    a terminal which is arranged in a second area adjacent to the first area and is connected to the detector, and
the first hole is located in a position which overlaps the terminal in a plan view.

10. The electronic device according to claim 9, further comprising a detection circuit which is electrically connected to the first conductive layer and reads a sensor signal output from the second conductive layer.

11. The electronic device according to claim 9, wherein the first substrate includes a driving electrode which is opposed to the second conductive layer.

12. An electronic device comprising:
a first substrate which includes a first conductive layer;
a second substrate which includes
    a basement which has
        a first surface opposed to the first conductive layer and separated from the first conductive layer, and
        a second surface opposite to the first surface,
    a second conductive layer which is arranged on the second surface, and
    a first hole which penetrates through between the first surface and the second surface; and
a connecting material which electrically connects the first conductive layer and the second conductive layer via the first hole, wherein
    the first hole has a first opening on a first surface side, a second opening on a second surface side, and an intermediate portion which is located between the first opening and the second opening, and
    a width of the intermediate portion is smaller than a first width of the first opening and a second width of the second opening.

13. The electronic device according to claim 12, wherein the first hole has a shape that a width decreases from the first opening toward the intermediate portion and increases from the intermediate portion toward the second opening in a sectional view.

14. The electronic device according to claim 12, wherein the first width is smaller than the second width.

15. The electronic device according to claim 12, wherein the connecting material covers an inner surface of the first hole.

16. The electronic device according to claim 12, wherein the connecting material inside the first hole is formed between the second conductive layer and an inner surface of the first hole.

17. The electronic device according to claim 12, wherein the second conductive layer inside the first hole is formed between the connecting material and an inner surface of the first hole.

18. The electronic device according to claim 12, further comprising a protection layer which covers the second conductive layer and the connecting material.

19. The electronic device according to claim 18, wherein the protection layer includes a first protection layer which covers the second conductive layer, and a second protection layer which covers the connecting material.

20. The electronic device according to claim 12, wherein the second conductive layer includes
    a detector which detects an object in contact with or in proximity to a first area, and
    a terminal which is arranged in a second area adjacent to the first area and is connected to the detector, and
the first hole is located in a position which overlaps the terminal in a plan view.

\* \* \* \* \*